(12) United States Patent
Zabih et al.

(10) Patent No.: US 8,103,068 B2
(45) Date of Patent: Jan. 24, 2012

(54) METHODS AND SYSTEMS FOR RECONSTRUCTION OF OBJECTS

(75) Inventors: Ramin D. Zabih, New York, NY (US); Ashish Raj, San Francisco, CA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 1152 days.

(21) Appl. No.: 11/864,088

(22) Filed: Sep. 28, 2007

(65) Prior Publication Data

US 2008/0080775 A1  Apr. 3, 2008

Related U.S. Application Data

(60) Provisional application No. 60/848,319, filed on Sep. 29, 2006.

(51) Int. Cl.
*G06K 9/00* (2006.01)
(52) U.S. Cl. ...................................................... 382/128
(58) Field of Classification Search .................. 382/128, 382/130, 131; 128/922; 600/410, 425
See application file for complete search history.

(56) References Cited

U.S. PATENT DOCUMENTS

| | | | | |
|---|---|---|---|---|
| 6,470,220 | B1* | 10/2002 | Kraus et al. | 607/103 |
| 6,744,923 | B1* | 6/2004 | Zabih et al. | 382/226 |
| 6,973,212 | B2* | 12/2005 | Boykov et al. | 382/173 |
| 7,430,339 | B2* | 9/2008 | Rother et al. | 382/284 |
| 2002/0114532 | A1* | 8/2002 | Ratner et al. | 382/266 |
| 2003/0206652 | A1* | 11/2003 | Nister | 382/154 |
| 2004/0008886 | A1* | 1/2004 | Boykov | 382/173 |
| 2004/0166869 | A1* | 8/2004 | Laroia et al. | 455/450 |
| 2005/0105786 | A1* | 5/2005 | Moreau-Gobard et al. | 382/128 |
| 2005/0134587 | A1* | 6/2005 | Geiger et al. | 345/423 |
| 2005/0135664 | A1* | 6/2005 | Kaufhold et al. | 382/131 |
| 2005/0238215 | A1* | 10/2005 | Jolly et al. | 382/128 |
| 2006/0029275 | A1* | 2/2006 | Li et al. | 382/173 |
| 2006/0285747 | A1* | 12/2006 | Blake et al. | 382/180 |
| 2007/0003154 | A1* | 1/2007 | Sun et al. | 382/254 |
| 2007/0014473 | A1 | 1/2007 | Slabaugh et al. | 382/173 |
| 2007/0016549 | A1 | 1/2007 | Whitcher | 707/1 |
| 2007/0025616 | A1 | 2/2007 | Grady et al. | 382/173 |

FOREIGN PATENT DOCUMENTS

KR   05/007626   1/2005

OTHER PUBLICATIONS

Hammer, P. et al. Roof duality, complementation and persistency in quadratic 0-1 optimization. Mathematical Programming 1984; 28: 121-155.

Raj, A. et al. A Graph Cut Algorithm for Generalized Image Deconvolution. Proc. International Conference of Computer Vision 2005.

Raj, A. et al. Bayesian Parallel Imaging with Edge-Preserving Priors. Magnetic Resonance in Medicine, Jan. 2007.

Raj, A. et al. Bayesian Reconstruction of MR Images via Graph Cuts. IEEE Computer Vision and Pattern Recognition Conference 2006.

(Continued)

*Primary Examiner* — Jason M Repko
*Assistant Examiner* — Shervin Nakhjavan
(74) *Attorney, Agent, or Firm* — Burns & Levinson, LLP; Jacob N. Erlich, Esq.; Orlando Lopez, Esq.

(57) ABSTRACT

Methods and systems for reconstructing an object from observations of interaction of the object with a physical system.

24 Claims, 14 Drawing Sheets

EXPRESSING THE RECONSTRUCTION OF AN OBJECT AS MINIMIZATION OF A FUNCTION
10

APPLYING A PREDETERMINED TRANSFORMATION, SAID PREDETERMINED TRANSFORMATION CONVERTING THE FUNCTION INTO ANOTHER FUNCTION
15

MINIMIZING THE OTHER FUNCTION BY THE MINIMIZATION METHOD UTILIZING GRAPH CUTS
20

OTHER PUBLICATIONS

Boykov, Y. et al. Fast Approximate Energy Minimization via Graph Cuts. IEEE Transactions on Pattern Analysis and Machine Intelligence (PAMI) 23 (11) 1222-1239, 2001.

Kolmogorov, V. et al. Minimizing non-submodular functions with graph cuts—a review. Pattern Analysis and Machine Intelligence (PAMI) Jul. 2007; 29(7) (older version as technical report: MSR-TR-2006-100).

Nordell, A. Master of Science Thesis, Royal Institute of Technology, Stockholm, Sweden, Jun. 2004.

Hoge, W.S. et al. A tour of accelerated parallel MR imaging from a linear systems perspective. Concepts Magn Recon Part A, 27A(1):17-37, Sep. 2005.

* cited by examiner

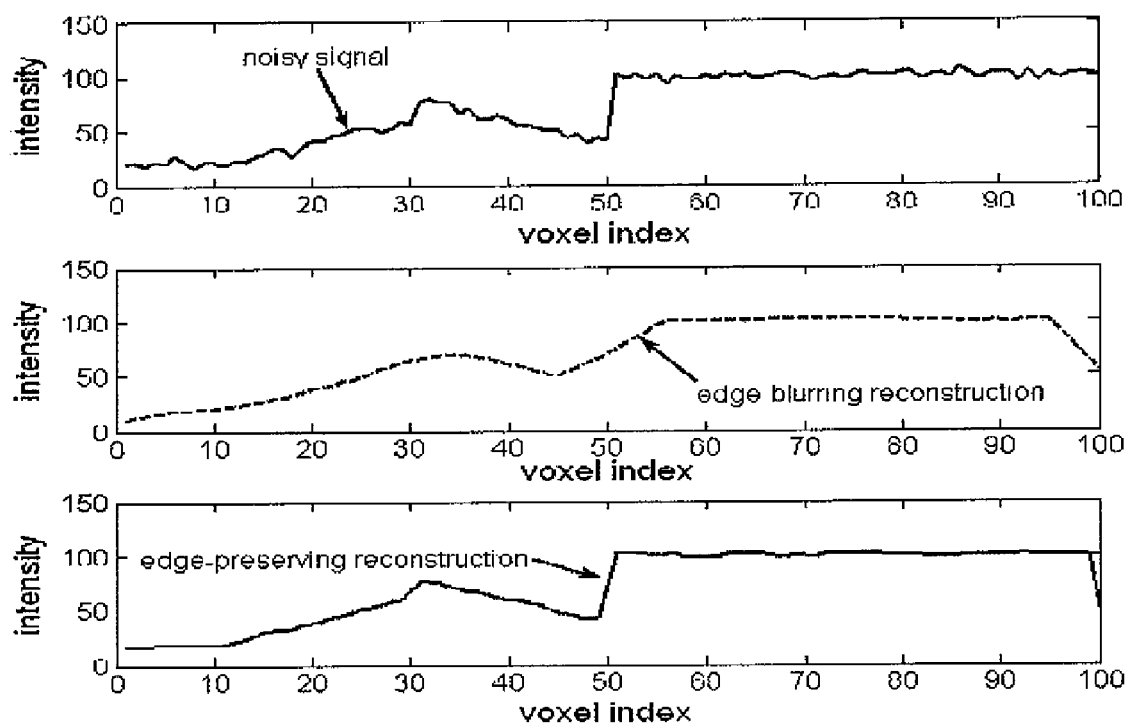
Figure 2a-c (c) Binary image (b) Expansion move (a) Input labeling $f$

 
(a) (b)
 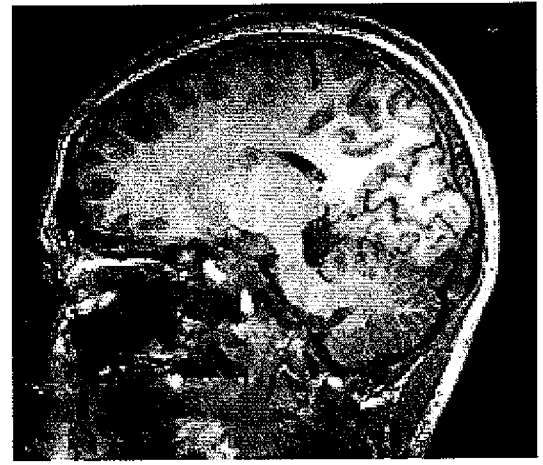
(c) (d)
Figures 7a-d

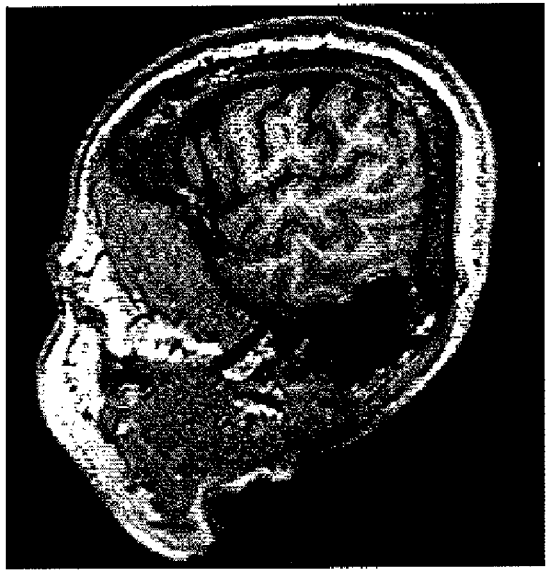
(a)
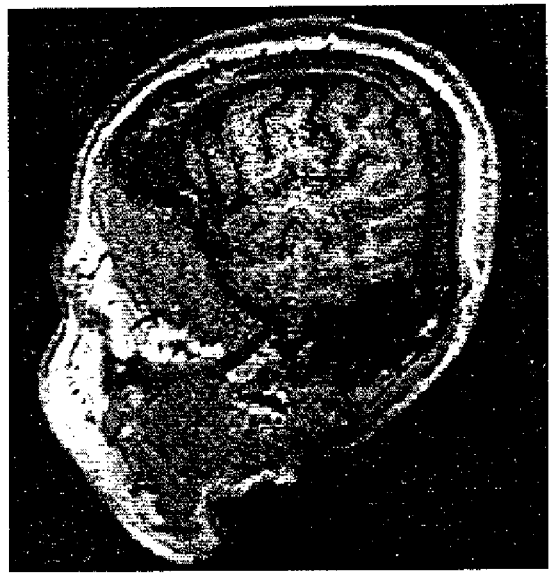
(b)
(c)
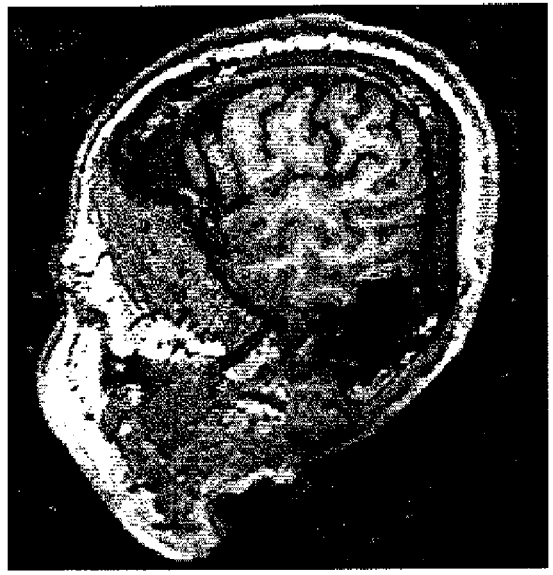
(d)
Figures 8a-d

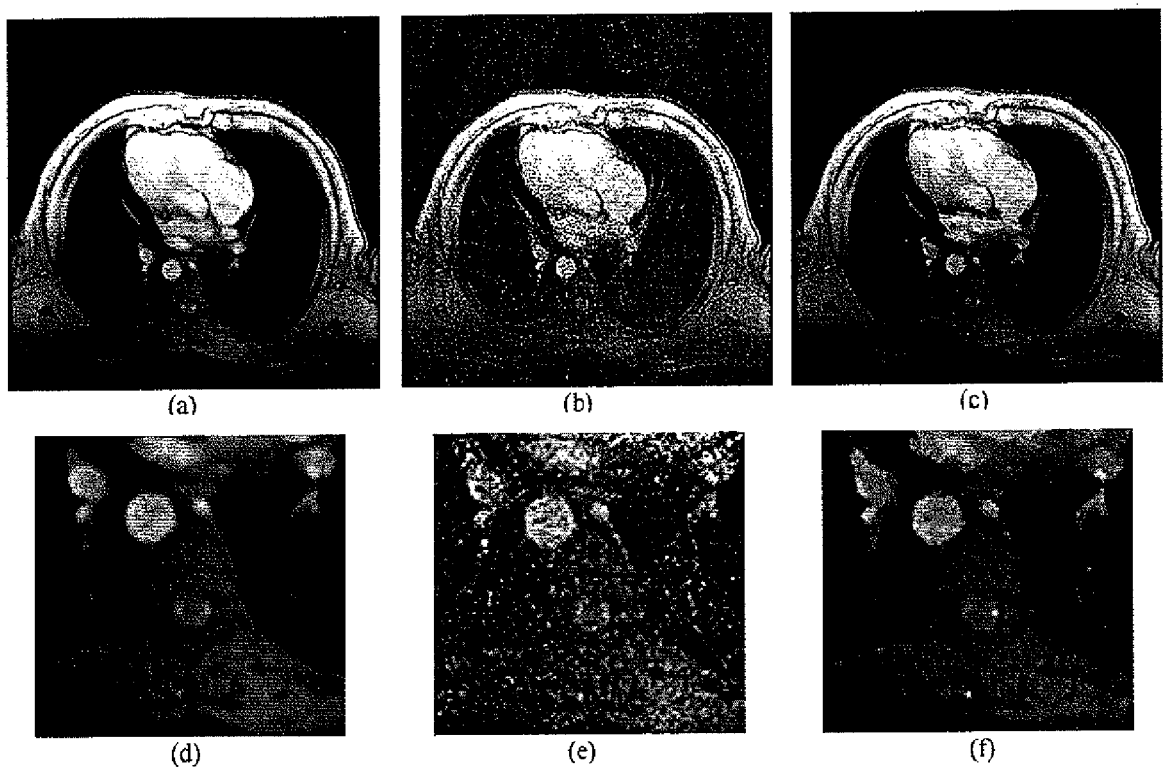
Figures 9a-f

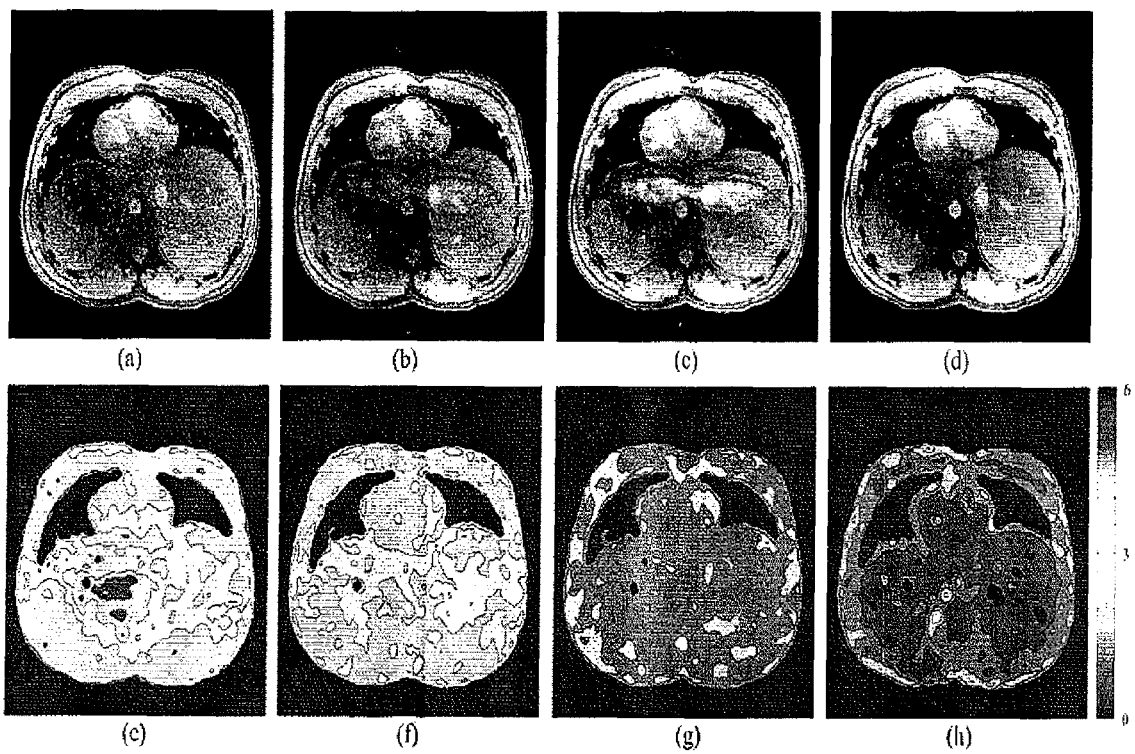
Figures 10a-h

METHODS AND SYSTEMS FOR RECONSTRUCTION OF OBJECTS

CROSS REFERENCE TO RELATED APPLICATIONS

This application claims priority of U.S. Provisional Patent Application Ser. No. 60/848,319, entitled METHODS AND SYSTEMS FOR RECONSTRUCTION OF MR IMAGES, filed on Sep. 29, 2006, which is incorporated by reference herein in its entirety.

BACKGROUND

In a number of situations in a variety of fields, ranging from reconstruction of MR images, other medical image reconstructions, image deblurring, to temperature estimation in transient problems (including automotive applications) and vibrations and geophysics (such as the seismic inverse problem), the problem reduces to reconstructing an object from observations of interaction of the object with a physical system.

One illustrative but very practicality important, example of the solution of this type of problem is the reconstruction of MR images. Magnetic resonance (MR) imaging has great importance, both for clinical and for research applications, due to its safety and exibility. The MR imaging process, however, imposes a fundamental tradeoff between image quality and scan time. It is very important to reduce scan time, for a number of reasons. The primary issue is that MR is very sensitive to motion artifacts, so reducing scan times decreases the odds of obtaining a poor-quality image. Some parts of the body, notably the heart and lungs, undergo periodic motion; as a result, only sufficiently fast scans can be used to image these organs, or any other adjacent tissues. In addition, there are obvious issues of patient comfort as well as cost that arise from lengthy scans. Finally, if the basic image acquisition process were faster, even for a xed scan duration a higher signal to noise ratio could be obtained. This is important for many important modalities, such as fMRI, perfusion, diffusion or time-resolved angiography, where the physical process being imaged takes place over short time periods.

There is a need for better algorithms to result in faster (and hence better) MR. The image formation process in MR is quite unlike a conventional camera, and this in turn leads to a number of interesting computational challenges. In MR, an image is acquired as its Fourier transform (usually called "k-space"), and this acquisition takes place serially. Typically one row in k-space is acquired at a time, and each row takes tens of milliseconds to acquire (the details depend on the particular study being performed).

A particularly important technique for accelerating MR scans is called parallel imaging, which uses multiple receiver coils. According to a recent survey article "Parallel imaging is one of the most promising recent advances in MRI technology and has revolutionized MR imaging". While parallel imaging requires solving a linear inverse problem, existing methods either do not incorporate spatial priors, or assume that the image is globally smooth. In computer vision, of course, Markov Random Fields (MRF's) are commonly used to encode better priors.

The parallel imaging problem is illustrated in FIG. 1a. FIG. 1a is a schematic of the pixel-wise aliasing process, for a single pair of aliasing pixels p and p', for 2× acceleration using 3 coils. The aliased observations Y are obtained by a weighted sum of the aliasing pixels, weighted by coil sensitivity values $S_1$. To simplify the figure, aliasing is shown in the horizontal direction. The scan time can be reduced in half by dropping every other column in k-space. The resulting image, when reconstructed from a conventional RF receiver coil, is an aliased image like those shown in the top row of FIG. 1a. Such an image is half the width of the original (unobserved) image shown in the bottom row. It is formed by multiplying the original image by a slowly varying function S(p) and then adding the left half of the resulting image to the right half. The multiplication by S(p) comes from the spatial response of the coil, while the addition of the two image halves is a consequence of dropping alternate k-space columns. Thus, each pixel p in the aliased image is the weighted sum of two pixels (p,p') in the original image, where p' is in the same row but half the width of the image away. The weights come from the function S.

If only had a single aliased image were available, it would be impossible to reconstruct the original image. However, we multiple coils can be used, each of which has a different S, without increasing the scan time. In the above example, there is a simple linear system for each pair of pixels p, p':

$$\begin{bmatrix} Y_1(p) \\ Y_2(p) \\ Y_3(p) \end{bmatrix} = \begin{bmatrix} S_1(p) & S_1(p') \\ S_2(p) & S_2(p') \\ S_3(p) & S_3(p') \end{bmatrix} \begin{bmatrix} X(p) \\ X(p') \end{bmatrix}. \quad (1)$$

The functions S are called sensitivity maps, and can be computed in advance. In addition, the sum over the coils is usually normalized:

$$\sum_{l=1}^{L} S_l^2(p) \approx 1.$$

Formally, assuming Cartesian sampling in k-space, an (unobserved) true image X is desired, which must be reconstructed from the sensitivity maps S1, ... S1, ... SL and the coil outputs Y1, ... Y1, ... YL. While X and S1 are of size $N_x M$, Y1 is of size $$\frac{N}{R} M,$$

where the acceleration factor is R. By stacking the receiver coil outputs into the column vector y and the image into x, the image formation process can be expressed as $$y = Ex \quad (2)$$

where the encoding matrix E contains the sensitivity maps.

Least squares can be used to compute the maximum likelihood estimate from equation (2)

$$\hat{x}_{SENSE} = (E^H E)^{-1} E^H y \quad (3)$$

This is an MR reconstruction algorithm called SENSE, which has been widely applied in research and clinical systems. Tikhonov-style regularization methods are also commonly used to handle the ill-conditioning of H. The most general form of these methods is $$\hat{x}_{regSENSE} = \arg\min_x \{\|Ex - y\|^2 + \mu^2 \|A(x - x_T)\|^2\} \quad (4)$$

Here, the second term penalizes that are far from a prior reference image $x_r$, and that are not spatially smooth according to the regularizer matrix A. The regularization parameter μ controls the tradeoff between aliasing and local noise in the output. Note that since A is a linear operator, global spatial smoothness is imposed. There is a simple closed-form solution for this equation.

FIG. 1a is typical of the parallel imaging problem, for 2× acceleration with 3 coils. The unobserved image is shown at bottom, and the aliased image observed from each coil is shown at top. Each pixel in an aliased image is the weighted sum of two pixels in the unobserved image. The weights are different for each pixel and each aliased image. The linear system that relates the unobserved image to the observations is given in equation (1).

Every clinical system, and almost every research paper in MR, computes some variant of $x^{\wedge}_{reg}$. The original paper on SENSE did not perform regularization (i.e., μ=0). For numerical reasons, authors proposed variants of equation (4), typically using the identity matrix for A. While this does not impose spatial smoothness, it has significant computational advantages in terms of the structure of H. Even the most general variants of this method, however, can only impose spatial smoothness globally, and give poor performance for acceleration factors significantly greater than 2.

Other reconstructions of an object from observations of interaction of the object with a physical system have similar detailed descriptions.

BRIEF SUMMARY

In one embodiment, the method of these teachings includes the steps of expressing the reconstruction of an object as the minimization of an energy-like function, applying a predetermined transformation that converts the energy-like function into another energy-like function, the other energy-like function being amenable to minimization by graph cuts, and minimizing the other energy-like function by graph cuts, thereby obtaining the reconstruction.

Since the reconstruction of an object from observations of interaction of the object with a physical system is in some embodiments the reconstruction of an image while in other embodiments images are not the object of interest, the term "pixel" as used herein refers to, in non-image embodiments, one individual element (or one individual data element) in a signal, typically a multidimensional signal. For image reconstruction embodiments, the term "pixel" (or the equivalently used term "voxel") is used in the manner customary in the art.

In another embodiment of the method of these teachings, the embodiment includes the steps of:
a) providing an initial solution having a number of labels, wherein each pixel from a number of pixels has a corresponding pixel label;
b) forming a graph from the initial solution, the graph being comprised of nodes and of edges connecting the nodes, each pixel having a corresponding node;
c) selecting a move from the graph, wherein the move comprises assigning a new corresponding pixel label to at least one pixel;
d) assigning to each pixel a binary variable indicating whether the pixel acquired the new corresponding pixel label in the move;
e) assigning to each pixel another binary variable, the other binary variable being a complement of the binary variable; the other function being a function of the binary variable and the other binary variable; the other function being submodular; a submodular function of two variables being a function wherein a sum of two consecutive diagonal terms is at most equal to a sum of two offdiagonal terms, each one of the two of diagonal terms being adjacent to each one of the two consecutive diagonal terms
f) assigning a weight value to each edge of the graph;
g) determining a minimum graph cut in response to the assigned weights, wherein a graph cut comprises a subset of the edges; a minimum graph cut having a smallest value of the other function;
h) forming a graph from results of the minimum graph cut; and
i) repeating steps c, f-h until a substantially minimum value of the other function is reached.

Other embodiments of the method of these teachings are also disclosed. Systems and computer program products that implement the methods are also disclosed.

For a better understanding of the present teachings, together with other and further needs thereof, reference is made to the accompanying drawings and detailed description and its scope will be pointed out in the appended claims.

BRIEF DESCRIPTION OF THE DRAWINGS

FIGS. 2a-2c are graphical representations of typical performance of conventional edge-preserving and edge-blurring reconstruction on noisy image row;

FIGS. 7a-7d Brain A: In vivo brain result with R=4, L=8. Views were acquired vertically. (a) Reference image (b) SENSE regularized with μ=0.08 (c) SENSE regularized with μ=0.16, (d) EPIGRAM reconstruction;

FIGS. 8a-8d Brain B: In vivo brain result with R=5, L=8. Views were acquired vertically. (a) Reference image (b) SENSE regularized with μ=0.1 (c) SENSE regularized with μ=0.2, (d) EPIGRAM reconstruction;

FIGS. 9a-9f present comparison of reconstructions utilizing conventional techniques and reconstructions utilizing embodiments of the method of these teachings for Cardiac A: in vivo result R=3, L=8; 9(a) presents the Reference image 9(b) presents reconstructions utilizing SENSE regularized with μ=0.16 (optimal) 9(c) present EPIGRAM reconstruction and zoomed-in portions of (a)-(c) are shown in 9(d)-9(f);

FIG. 10a-10h present further comparison of reconstructions utilizing conventional techniques and reconstructions utilizing embodiments of the method of these teachings for Cardiac B: in vivo result R=3, L=8—effect of regularization on g-factor maps;

DETAILED DESCRIPTION

The problem of reconstructing an object from data obtained from interaction of the object with a "system" is usually referred to as the inverse problem. There are many examples of applications of inverse problems. The method and system described hereinbelow are described for illustrative purposes in terms of MR image reconstruction. But it should be noted that these teachings are not limited only to that illustrative example and other application of embodiments of the method and system of these teachings are within the scope of these teachings. The term "object" as used herein refers to the input (or source) in a system or a representation of the input or source in a system including multidimensional signals used to represent the object. The term "system" as used herein is used in the sense of systems theory in engineering (electrical or mechanical engineering in most cases) where an input or source to the system results in output data. The nouns "function" and "functional" are used interchangeably where the meaning would be clear to one skilled in the art. In the illustrative embodiment of MR imaging, although the source is a physical body exposed to predetermined time varying magnetic fields, the reconstruction of the source results in MR images. The system in the illustrative embodiment of MR imaging includes the MR receiver coils.

Various concepts of MR image reconstruction referred to in this application are conventional, for example, the SENSE algorithms, the system configuration, and thus they need not be described in detail herein. These concepts are described, for instance, in "An investigation of the MR parallel imaging technique through sensitivity encoding (SENSE) and simulation of coil arrays designated for pediatric MR imaging," Anders Nordell, Master of Science Thesis, Royal Institute of Technology, Stockholm, Sweden, June 2004; and in W. Scott Hoge, Dana H. Brooks, Bruno Madore, Walid E. Kyriakos, "A tour of accelerated parallel MR imaging from a linear systems perspective," Concepts Magn Recon Part A, 27A(1): 17-37, September 2005. A voxel, as used herein, is volume pixel, the smallest distinguishable box-shaped part of a three-dimensional image. Voxels are obtained by including depth by means of cross-sectional images ("slices") where the cross-sectional images are comprised of pixels. The terms voxel and pixel are used somewhat interchangeably hereinbelow since a voxel is comprised of slices comprised of pixels. The term "pixel" as used herein refers to, in non-image embodiments, one individual element (or one individual data element) in a signal, typically a multidimensional signal. The term "voxel" or pixel includes the smallest element of a regular grid for values of a signal used to represent an object.

Figure 1A:
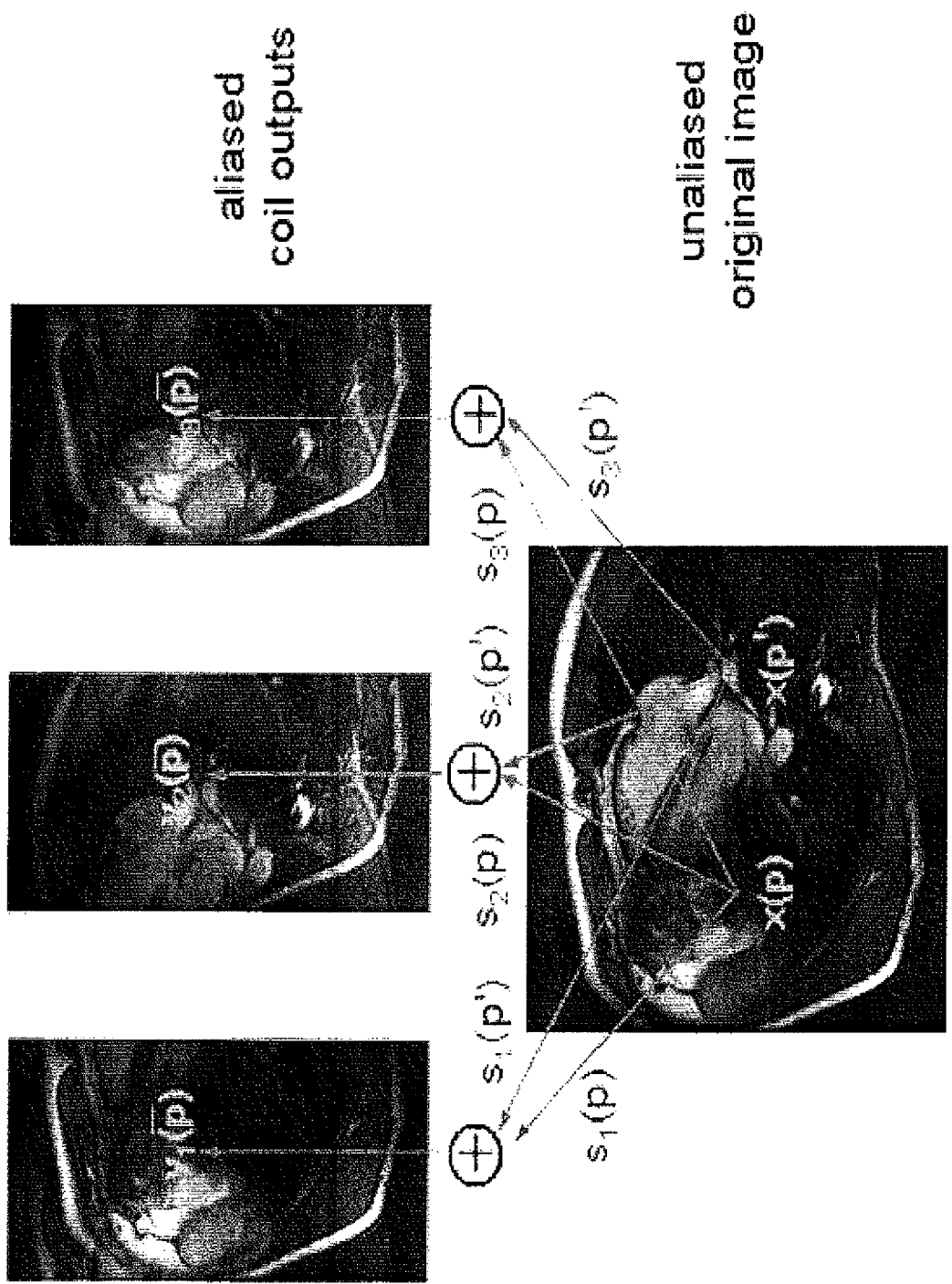
FIG. 1a is a schematic representation of a conventional pixel-wise aliasing process.
Figure 1B:
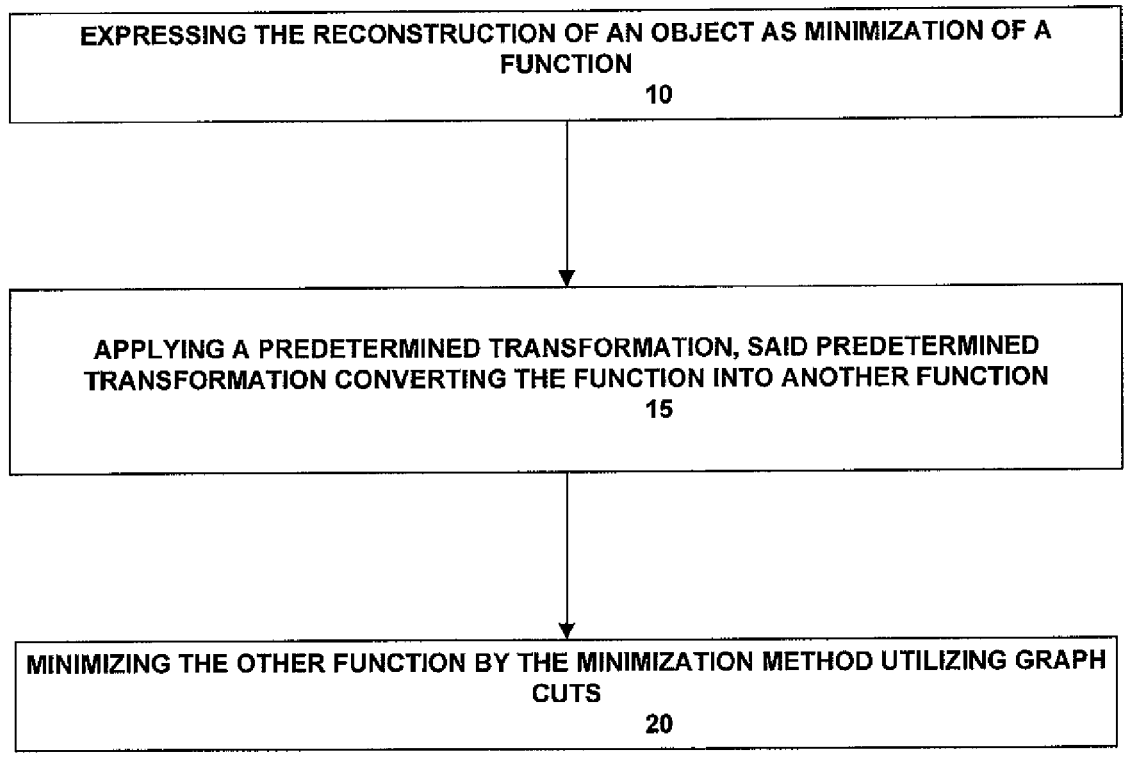
FIGS. 1b-1c are schematic flowchart representations of embodiments of the method of these teachings.

In one embodiment, shown in FIG. 1b, the method of these teachings includes the steps of expressing the reconstruction of an object as the minimization of an energy-like function (step 10, FIG. 1b), applying a predetermined transformation that converts the energy-like function into another energy-like function (step 15, FIG. 1b), the other energy-like function being amenable to minimization by graph cuts, and minimizing the other energy-like function by graph cuts (step 20, FIG. 1b), thereby obtaining the reconstruction.

Figure 1C:
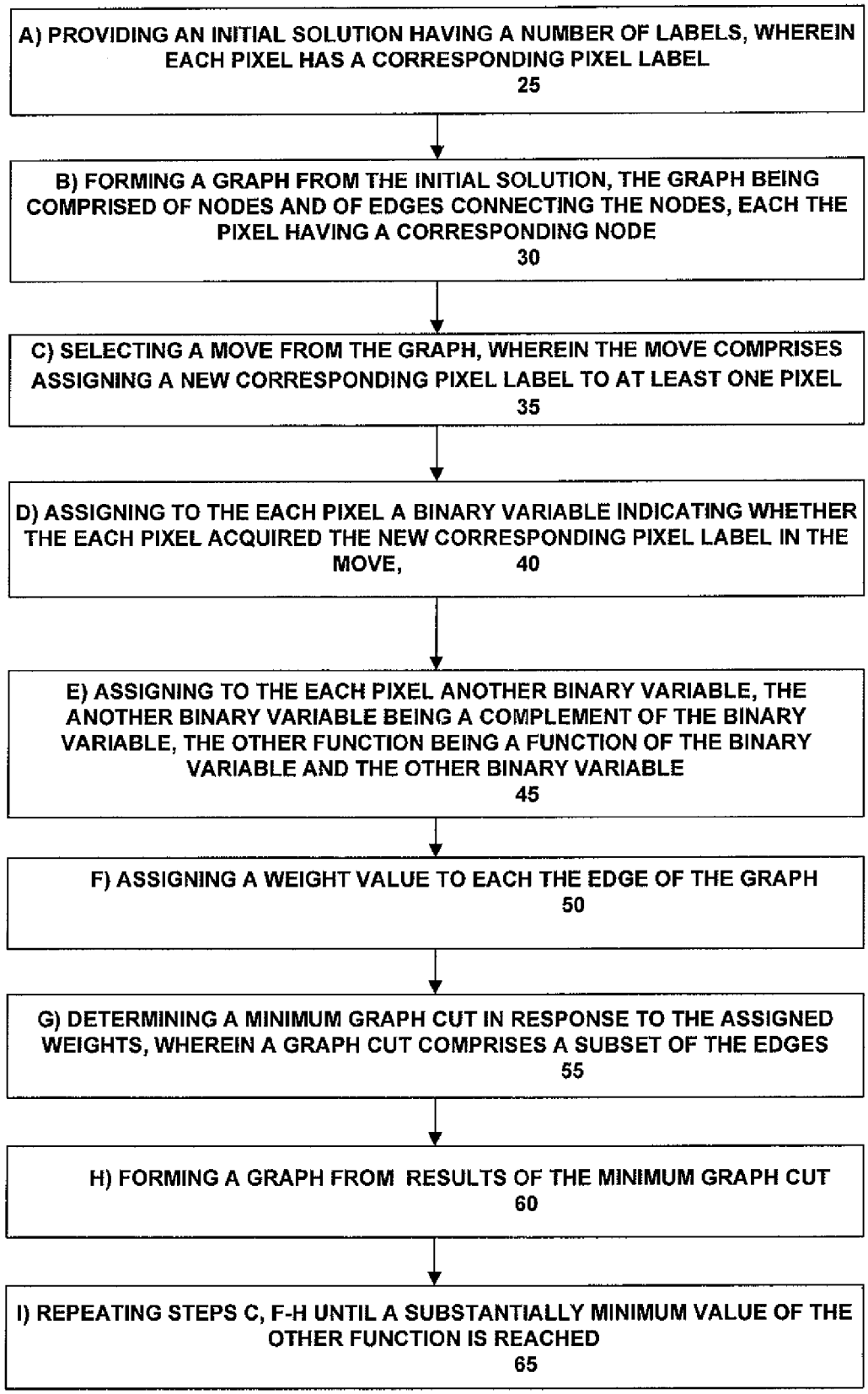

Another, more detailed, embodiment of the method of these teachings, the minimization method utilizing graph cuts and the steps of applying the predetermined transformation and minimizing the other function by the minimization method utilizing graph cuts includes the steps shown in FIG. 1c. Referring to FIG. 1c, the embodiment shown therein includes the steps of:
 a) providing an initial solution having a number of labels, wherein each pixel from a number of pixels has a corresponding pixel label (step 25, FIG. 1c);
 b) forming a graph from the initial solution, the graph being comprised of nodes and of edges connecting the nodes, each pixel having a corresponding node (step 30, FIG. 1c);
 c) selecting a move from the graph, wherein the move comprises assigning a new corresponding pixel label to at least one pixel (step 35, FIG. 1c);
 d) assigning to each pixel a binary variable indicating whether the pixel acquired the new corresponding pixel label in the move (step 40, FIG. 1c);
 e) assigning to each pixel another binary variable, the other binary variable being a complement of the binary variable (step 45, FIG. 1c); the other function being a function of the binary variable and the other binary variable; the other function being submodular; a submodular function of two variables being a function wherein a sum of two consecutive diagonal terms is at most equal to a sum of two offdiagonal terms, each one of the two of diagonal terms being adjacent to each one of the two consecutive diagonal terms;
 f) assigning a weight value to each edge of the graph (step 50, FIG. 1c);
 g) determining a minimum graph cut in response to the assigned weights (step 55, FIG. 1c), wherein a graph cut comprises a subset of the edges; a minimum graph cut having a smallest value of the other function;
 h) forming a graph from results of the minimum graph cut (step 60, FIG. 1c); and
 i) repeating steps c, f-h until a substantially minimum value of the other function is reached (step 65, FIG. 1c).

In one instance, in the embodiment shown in FIG. 1b, the predetermined transformation comprises assigning to each pixel from a number of pixels a binary variable indicating whether each pixel acquired the new corresponding pixel label in the move, assigning to each pixel another binary variable, the other binary variable being a complement of the binary variable, applying a predetermined transformation, the other function being a function of the binary variable and the other binary variable; the other function being submodular; a submodular function of two variables being a function wherein a sum of two consecutive diagonal terms is at most equal to a sum of two offdiagonal terms, each one of the two of offdiagonal terms being adjacent to each one of the two consecutive diagonal terms.

In another instance, in the embodiment shown in FIG. 1b, the minimization method utilizing graph cuts comprises the steps of:
 a) providing an initial solution having a plurality of labels, wherein each pixel from a plurality of pixels has a corresponding pixel label from the plurality of labels;
 b) forming a graph from said initial solution, said graph being comprised of nodes and of edges connecting said nodes, each said pixel having a corresponding node;
 c) selecting a move from the graph, wherein said move comprises assigning a new corresponding pixel label to at least one pixel from said plurality of pixels;
 d) assigning a weight value to each edge of the graph;
 e) determining a minimum graph cut in response to the assigned weights, wherein a graph cut comprises a subset of said edges; a minimum graph cut having a smallest value of a cost;
 f) forming another graph from graphing results of the minimum graph cut; and
 g) repeating steps c-f until an acceptable solution according to a predetermined criterion is reached.

In another instance, in the minimization method disclosed hereinabove, the move is an α-expansion; wherein the α-expansion comprises assigning a label α to a subset of the pixels, said subset having at least one pixel.

In yet another instance, in the minimization method disclosed hereinabove, the predetermined criterion includes obtaining a substantially minimum cost and the cost is the other function disclosed hereinabove.

Prior to proceeding with a description of illustrative applications of embodiments of the present teachings, concepts related to illustrative embodiments are disclosed hereinbelow.

Even with regularization there is a noise/unfolding limit. If μ is too small, there will be insufficient noise reduction. If μ is too high, noise will be removed but residual aliasing will occur. This fundamental aliasing/noise limit cannot be overcome unless more information about the data is exploited. This naturally suggests a Bayesian approach, a subject of some recent work. Given the imaging process, observation and the prior probability distribution of the target image, Bayesian methods maximize the posterior probability $$\Pr(x/y) \propto \Pr(y/x) \cdot \Pr(x) \quad [5]$$

The first right-hand term, called the likelihood function, comes from the imaging model, and the second term is the prior distribution. In the absence of a prior, this reduces to maximizing the likelihood, as performed by SENSE. Assuming that the noise is white Gaussian noise, y=Ex implies a simple Gaussian distribution for:

$$\Pr(y/x) \propto e^{-\|y-Ex\|^2} \quad [6]$$

Similarly, the prior can be written, without loss of generality, as $$\Pr(x) \propto e^{-G(x)} \quad [7]$$

Depending on the term G(x), this form can succinctly express both the traditional Gaussianity and/or smoothness assumptions, as well as more complicated but powerful Gaussian or Gibbsian priors modeled by Markov Random Fields (MRFs). The posterior is maximized by $$\hat{x}_{MAP} = \arg\min_x (\|y - Ex\|^2 + G(x)), \quad [8]$$

which is the maximum a posteriori (MAP) estimate. Conventional image priors impose spatial smoothness; hence this can be viewed as the sum of a data penalty and a smoothness penalty. The data penalty forces x to be compatible with the observed data, and the smoothness penalty G(x) penalizes solutions that lack smoothness. Traditionally, only smoothness penalties of the kind $G(x)=\|Ax\|^2$ have been used, where A is a linear differential operator. This corresponds to $$\hat{x}_{regSENSE} = x_r + (E^H E + \mu^2 A^H A)^{-1} E^H (y - Ex_r)$$

if the reference image $x_r=0$ and is commonly known as Tikhonov regularization.

However, this smoothness penalty assumes that intensities vary smoothly across the entire image. Such an assumption is inappropriate for most images, since most image data change smoothly, but have discontinuities at object boundaries. As a result, Tikhonov smoothness penalty causes excessive edge blurring, while an edge-preserving G is desired in the embodiment disclosed herein. To illustrate this, FIG. 2(a) shows a single noisy image row, and FIGS. 2(b)-2(c) show two possible strategies to de-noise it. FIGS. 2a-2c are graphical representations of typical performance of edge-preserving and edge-blurring reconstruction on noisy image row. FIG. 2(b) was obtained by globally smoothing via a Gaussian kernel, FIG. 2(c) by an edge-preserving median filter. The difference in performance between global smoothing (obtained by Gaussian blurring) and edge-preserving smoothing (via median filtering) is apparent; whereas both denoise the signal, one over-smoothes sharp transitions, but the other largely preserves them.

In order to further illustrate the present teachings, exemplary embodiments, applied to MR image reconstruction, are presented herein below.

A natural class of edge-preserving smoothness penalties is:

$$G_{EP}(x) = \sum_{(p,q) \in N_s} V(x_p, x_q) \quad [9]$$

The spatial neighborhood system $N_\delta$ consists of pairs of adjacent pixels, usually the 8-connected neighbors. The separation cost $V(x_p, x_q)$ gives the cost to assign intensities $x_p$ and $x_q$ to neighboring pixels p and q; the form of this prior can be justified in terms of Markov Random Fields. Typically V has a non-convex form such as $V(x_p, x_q) = \lambda \min(|x_p - x_q|, K)$ for some metric |·| and constants K, λ. Such functions effectively assume that the image is piecewise smooth rather than globally smooth.

Figure 3A:
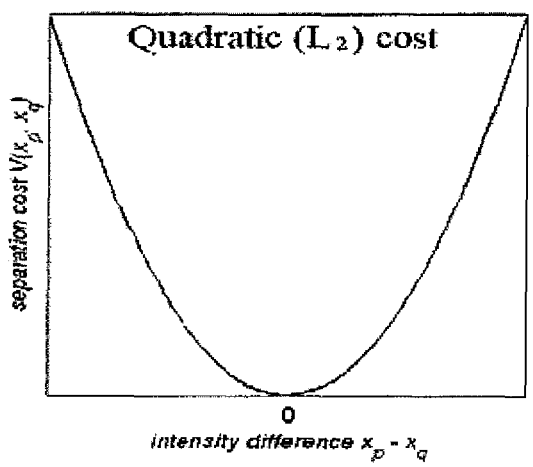
FIGS. 3a-3b are Two separation cost functions for spatial priors.
Figure 3B:
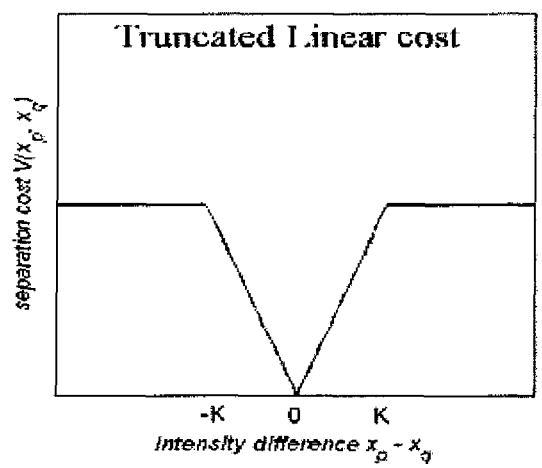

FIGS. 3a-3b are two natural separation cost functions for spatial priors. The $L_2$ cost on the left usually causes edge blurring due to excessive penalty for high intensity differences, whereas the truncated linear potential on the right is considered to be edge-preserving and robust. For MR data, the truncated linear model appears to work best. While the $L_2$ separation cost does not preserve edges, its convex nature vastly simplifies the optimization problem. For MR data the truncated linear model seems to present substantially the best balance between noise suppression (due to the linear part) as well as edge-preservation (due to truncation of penalty function). Therefore, neighboring intensity differences within the threshold K will be treated as noise and penalized accordingly. However, larger differences will not be further penalized, since they occur, most likely, from the voxels being separated by an edge. Note that this is very different from using a traditional convex distance for the separation cost, such as the $L_2$ norm, which effectively forbids two adjacent pixels from having very different intensities. Although the $L_2$ separation cost does not preserve edges, it is widely used since its convex nature simplifies the optimization problem.

A possible problem with the truncated linear penalty is that it can lead to some loss of texture, since the Bayesian estimate will favor images with piecewise smooth areas rather than textured areas. Ways to mitigate this characteristic are presented below.

The computational problem is to efficiently minimize $$\|y - Ex\|^2 + G_{EP}(x) \quad [10]$$

It is known that E has a diagonal block structure, and decomposes into separate interactions between R aliasing voxels, according to Eq. [1]. Let us first define for each pixel $\bar{p}=(\bar{i},j)$ in $Y_1$ the set of aliasing pixels in X that contribute to $Y_1$ ( ), as follows: For image X of size undergoing R-fold accel eration, aliasing only occurs in the phase encode direction, between aliasing pixels. Then $$\|y - Ex\|^2 = \sum_{\bar{p}} \sum_l \left[ Y_l(\bar{p}) - \sum_{[p]=\bar{p}} S_l(p) x_p \right]^2 \quad [11]$$

This can be understood by examining the aliasing process depicted in FIG. 1. After some rearrangement, this expands to:

$$\|y - Ex\|^2 = \sum_{\bar{p}} \sum_l Y_l^2(\bar{p}) + \sum_p \left( \sum_l S_l^2(p) \right) x_p^2 \quad [12]$$

$$2 \sum_p \left( \sum_l S_l(p) Y_l([p]) \right) x_p + 2 \sum_{(p,p') \in N_a} \left( \sum_l S_l(p) S_l(p') \right) x_p x_{p'}$$

where the aliasing neighborhood set is defined as $N_\alpha = \{(p, p') [p]=[p'], p \neq p'\}$ over all aliasing pairs. Grouping terms under single pixel and pairwise interactions, the following expression is obtained $$\|y - Ex\|^2 = a^2 + \sum_p b(p) x_p^2 - 2 \sum_p c(p) x_p + 2 \sum_{(p,p') \in N_a} d(p, p') x_p x_{p'}$$

for appropriately chosen functions b(p), c(p) and d(p,p').

The first term is a constant and can be removed from the objective function; the next two terms depend only on a single pixel while the last term depends on two pixels at once, both from the aliasing set. This last term, which is referred to as a cross term, arises due to the non-diagonal form of the system matrix E.

To perform edge-preserving parallel imaging, the objective function:

$$\varepsilon(x) = a^2 + \sum_p b(p) x_p^2 - 2 \sum_p c(p) x_p + \quad [13]$$

$$2 \sum_{(p,p') \in N_a} d(p, p') x_p x_{p'} + \sum_{(p,q) \in N_s} V(x_p, x_q) [15]$$

has to be substantially minimized.

Considering first the simpler case of the objective function that would arise if E were diagonal. In this case there would be no cross terms (i.e., d(p,p')=0), which appears to simplify the problem considerably. Yet even this simplification results in a difficult optimization problem. There is no closed form solution, the objective function is highly non-convex, and the space being minimized over has thousands of dimensions (one dimension per pixel). Worse still, minimizing such an objective function is almost certain to require an exponentially large number of steps.

If E were diagonal, however, the objective function would be in a form that has been extensively studied in computer vision, and where significant recent progress has been made. Specifically, a number of powerful methods have been designed for such problems, using a discrete optimization technique called graph cuts, which we briefly summarize in the next section. Graph cuts are a powerful method to minimize E in [13], and can be easily applied as long as E is diagonal. The presence of off-diagonal entries in E gives rise to cross terms in the objective function, making traditional graph cut algorithms inapplicable, and requiring an extension described in the hereinbelow.

Objective functions similar to [13] can be minimized by computing the minimum cut in an appropriately defined graph ("graph cuts"). This technique was first used for images, used to optimally denoise binary images. A recent series of papers extended the method significantly, so that it can now be used for problems such as stereo matching and image/video synthesis in computer vision; medical image segmentation; and fMRI data analysis (see also U.S. Pat. No. 6,744,923, which is incorporated by reference herein).

The basic idea is to first discretize the continuous pixel intensities $x_p$ into a finite discrete set of labels $\mathcal{L} = \{1, \ldots, N_{labels}\}$. Since the above exemplary embodiment relates to MR reconstruction problems, labels are assumed to be intensities, and use the terms interchangeably; however, the methods of theses teachings can be used on a wide variety of problems, and often use labels with a more complex meaning. Then instead of minimizing over continuous variables $x_p$ the above expression is minimize over individual labels $\alpha \in \mathcal{L}$, allowing any pixel in the image to take the label $\alpha$. In practice the dynamic range of intensities may need to be reduced for computational purposes, although this is not a requirement of the technique of these teachings. The most powerful graph cut method is based upon expansion moves. Given a labeling=$\{x_p | p \in \mathcal{P}\}$ $x=\{x_p | p \in \mathcal{P}\}$ and a label $\alpha$, an $\alpha$-expansion $\chi=\{\chi_p | p \in \mathcal{P}\}$ is a is a new labeling where $\chi_p$ is either $x_p$ or $\alpha$. Intuitively, is constructed from x by giving some set of pixels the label $\alpha$. The expansion move algorithm picks a label $\alpha$, finds the lowest cost $\chi$ and moves there. This is pictorially depicted in FIG. 4.

Figure 4C:
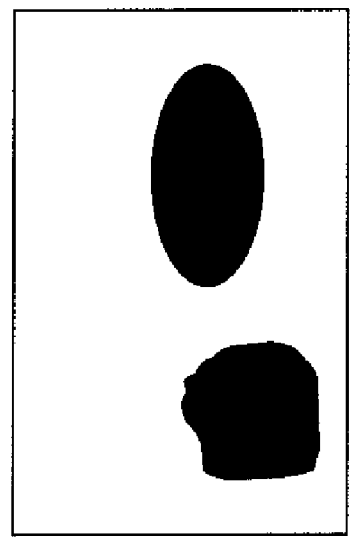
FIGS. 4a-4c is a graphical representation of the expansion move algorithm.
Figure 4B:
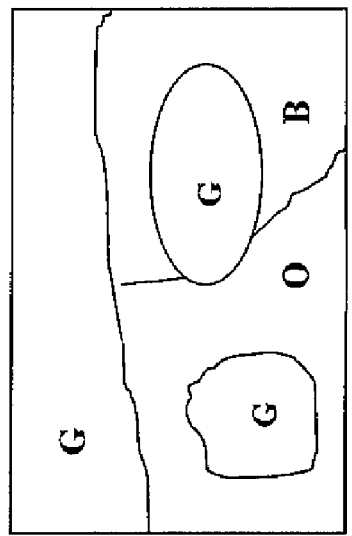
Figure 4A:
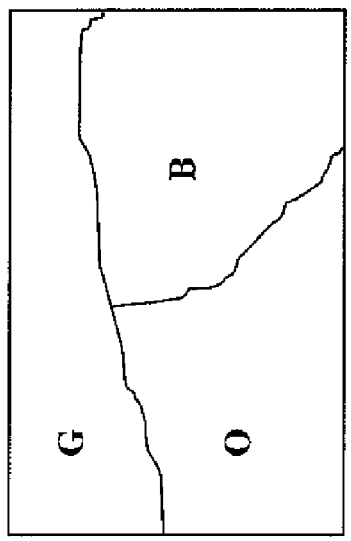

FIGS. 4a-4c depict the expansion move algorithm. Start with the initial labeling of the image shown by different color labels in (a), assuming only 3 labels. Note that here labels correspond to intensities, although this need not be the case in general. First find the expansion move on the label "green" ("G") that most decreases objective function E, as shown in (b). Move there, then find the best "orange" ("O") expansion move, etc. When no a-expansion move decreases the cost, for any label, the process is complete. Corresponding to every expansion move (b) is a binary image (c), where each pixel is assigned 1 if its label changes, and 0 if it does not.

The algorithm converges to a labeling where there is no $\alpha$-expansion that reduces the value of the objective function $\epsilon$ for any $\alpha$. The key subroutine in the expansion move algorithm is to compute the $\alpha$-expansion $\chi$ that minimizes E. This can be viewed as an optimization problem over binary variables, since during an $\alpha$-expansion each pixel either keeps its old label or moves to the new label. This is also shown in FIGS. 4a-4c. An $\alpha$-expansion $\chi$ is equivalent to a binary labeling b=$\{b_p | p \in \mathcal{P}\}$ where $$\chi_p = \begin{cases} x_p & \text{iff } b_p = 0 \\ \alpha & \text{iff } b_p = 1 \end{cases} \quad [14]$$

Just as for a labeling $\chi$ there is an objective function $\epsilon$, for a binary labeling b there is an objective function B. More precisely, assuming $\chi$ is equivalent to b, B is defined by $$B(b) = \epsilon(\chi)$$

The arguments x, α have been dropped for clarity, but the equivalence between the α-expansion χ and the binary labeling b clearly depends on the initial labeling x and on α.

In summary, the problem of computing the α-expansion that minimizes ε is equivalent to finding the b that minimizes the binary objective function B. The exact form of B will depend on ε. Minimization of ε proceeds via successive binary minimizations corresponding to expansion moves. The binary minimization subroutine is somewhat analogous to the role of line search in Conjugate Gradient, where a local minimum is repeatedly computed over different 1D search spaces. With graph cuts however, the binary subroutine efficiently computes the global minimum over $2^{|\mathcal{P}|}$ candidate solutions, where $|\mathcal{P}|$ is the number of pixels in the image. In contrast to traditional minimization algorithms like Conjugate Gradients, trust region, simulated annealing etc., graph cuts can therefore efficiently optimize highly non-convex objective functions arising from edge-preserving penalties.

Consider a binary objective function of the form $$B(b) = \sum_p B_1(b_p) + \sum_{p,q} B_2(b_p, b_q) \quad [15]$$

Here, $B_1$ and $B_2$ are functions of binary variables; the difference is that $B_1$ depends on a single pixel, while $B_2$ depends on pairs of pixels. Graph cut methods minimize B by reducing computing a minimum cut on an appropriately constructed graph. The graph consists of nodes which are voxels of the image as well as two special terminal nodes, as shown in FIG. 5.

Figure 5:
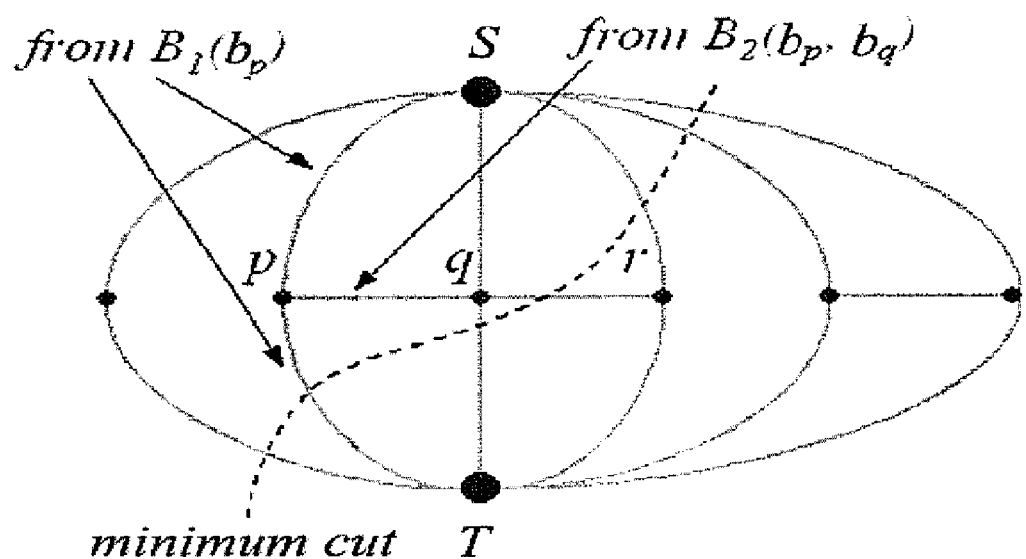
FIG. 5 is a graphical representation of a Graph construction for minimizing a given binary objective function.

FIG. 5 is a Graph construction for minimizing a given binary objective function. The graph consists of nodes corresponding to image voxels, as well as two special "terminal" nodes 'S' and 'T'. Edges between nodes represent single-voxel ($B_1$) and pairwise cost ($B_2$) terms. A minimum cut on this graph solves the binary minimization problem.

The voxel nodes have been labeled p, q, r etc and terminal nodes by S, T. All nodes are connected to both terminals via edges, each of which have weights obtained from the $B_1$ terms above. Nodes are also connected to each other via edges with weights obtained from the pairwise interaction term $B_2$.

The binary optimization problem can be solved by finding the minimum cut on this graph (Boykov Y, Veksler O, Zabih R. Fast Approximate Energy Minimization Via Graph Cuts. IEEE Transactions on Pattern Analysis and Machine Intelligence 2001; 23(11): 1222-39, incorporated by reference herein). A cut is defined as a partition of the graph into two connected subgraphs, each of which contains one terminal. The minimum cut minimizes the sum of the weights of the edges between the subgraphs. There are fast algorithms to find the minimum cut, using max-flow methods. It is shown in Kolmogorov V, Zabih R. What Energy Functions Can Be Minimized Via Graph Cuts? IEEE Transactions on Pattern Analysis and Machine Intelligence 2004; 26(2): 147-59, incorporated by reference herein, that the class of B that can be can be minimized exactly by computing a minimum cut on such a graph satisfies the condition $$B_2(0,0) + B_2(1,1) \leq B_2(1,0) + B_2(0,1) \quad [16]$$

If $B_2(x, y)$ satisfies [16], then it is said to be submodular with respect to x and y, and a function B is called submodular if it consists entirely of submodular terms. Single-variable terms of the form of $B_1$ are always submodular. The set of all pixel pairs for which $B_2(b_p, b_q)$ are submodular is referred to as the submodular set S. $\mathcal{S}$ Previous applications of graph cuts have been for diagonal E; this leads to no cross terms, and so $B_1$ comes solely from the data penalty and $B_2$ comes only from the smoothness penalty. It has been shown that if the separation cost is a metric then $B_2$ satisfies Eq. [16]. Many edge-preserving separation costs are metrics, including the truncated cost V used here and shown in FIG. 4(b) (see Boykov Y, Veksler O, Zabih R. Fast Approximate Energy Minimization Via Graph Cuts. IEEE Transactions on Pattern Analysis and Machine Intelligence 2001; 23(11): 1222-39, which is incorporated by reference herein, for details). However, the situation is more complicated in parallel MR reconstruction, where E is non-diagonal. As a result the data penalty has pairwise interactions due to the presence of the cross-terms in Eq. [15]. This also follows from FIG. 1a, which shows how this data penalty arises from the joint effect of both aliasing voxels p and p' in the image.

It was previously shown that the binary optimization problem arising from [15] is in general submodular only for a small subset of all cross terms. This necessitates the use of a subroutine (due to Hammer P, Hansen P, Simeone B., Roof duality, complementation and persistency in quadratic 0-1 optimization. Mathematical Programming 1984; 28: 121-155, incorporated by reference herein) to accommodate cross-terms arising in MR reconstruction, as described hereinbelow.

The subroutine used herein to find a good expansion move is closely related to relaxation methods for solving integer programming problems, where if the linear programming solution obeys the integer constraints it solves the original integer problem. An expansion move is computed by applying the algorithm of Hammer et. al., which was introduced into computer vision in early 2005 by Kolmogorov. The theoretical analysis and error bounds (presented in Raj A, Singh G, Zabih R. MRIs for MRFs: Bayesian Reconstruction of MR Images via Graph Cuts. IEEE Computer Vision and Pattern Recognition Conference 2006; 1061-1069, incorporated by reference herein) help explain the strong performance of this construction for MR reconstruction.

For each pixel p, there is a binary variable $b_p$ that was 1 if p acquired the new label and 0 otherwise. A new binary variable $\tilde{b}_p$ is introduced, which will have the opposite interpretation (i.e., it will be 0 if p acquired the new label and 1 otherwise). A pixel is called consistent if $b_p = 1 - \tilde{b}_p \cdot 1$. Instead of original objective function B(b), a new objective function $\tilde{B}(b, \tilde{b})$, is minimized, where b is the set of new binary variables $\tilde{b} = \{\tilde{b}_p | p \in P\}$. $\tilde{B}(b, \tilde{b})$ is constructed so that $\tilde{b} = 1 - b \Rightarrow \tilde{B}(b, \tilde{b}) = B(b)$ (in other words, if every pixel is consistent then the new objective function is the same as the old one). Specifically, the new objective functionis defined by $$2 \cdot \tilde{B}(b, \tilde{b}) = \sum_p \left(B_1(b_p) + B_1(1 - \tilde{b}_p)\right) + \sum_{(p,q) \in S} \left(B_2(b_p, b_q) + B_2(1 - \tilde{b}_p, 1 - \tilde{b}_q)\right) + \sum_{(p,q) \notin S} \left(B_2(b_p, 1 - \tilde{b}_q) + B_2(1 - \tilde{b}_p, b_q)\right) \quad [19]$$

Here, the functions $B_1(\cdot)$ and $B_2(\cdot)$ come from the original objective function B in [15].

Importantly, the new objective function is submodular. The first summation only involves $\tilde{B}(b, \tilde{b})$ is $B_1(\cdot)$, while for the remaining two terms, simple algebra shows that $B_2(b,b')$ is submodular $\Rightarrow B_2(1-b, 1-b')$ is submodular $B_2(b,b')$ is non-submodular $\Rightarrow$ both $B_2(b, 1-b')$ and $B_2(1-b, b')$ are submodular As a result, the last two summations in [17] only contain submodular terms. Thus $\tilde{B}(b, \tilde{b})$ is submodular, and can be easily minimized using the binary graph cut subroutine. In summary, minimizing $\tilde{B}(b,\hat{b})$ is exactly equivalent to minimizing the original objective function B, as long as a solution where every pixel is consistent is obtained. It should be noted that the above technique is not specific to MR reconstruction, but can compute the MAP estimate of an arbitrary linear inverse system under an edge-preserving prior $G_{EP}$.

While it cannot be guaranteed that all pixels are consistent, in practice this is true for the vast majority of pixels (typically well over 95%). In the above algorithm, pixels that are not consistent can be allowed to keep their original labels rather than acquiring the new label. However, even if there are pixels which are not consistent, the above subroutine has some interesting optimality properties. It has been shown that any pixel which is consistent is assigned its optimal label. As a result, the present algorithm finds the optimal expansion move for the vast majority of pixels, obtaining a substantially optimal result.

The convergence properties of the proposed technique have been investigated using simulated data from a Shepp-Logan phantom, with intensities quantized to integer values between 0 and 255. The objective function [13] achieved after each iteration is computed, for 3× acceleration and 8 coils.

High field strength (4 Tesla) structural MRI brain data was obtained using a whole body scanner (Bruker/Siemens Germany) equipped with a standard birdcage, 8 channel phased-array transmit/receive head-coil localized cylindrically around the S-I axis. Volumetric Ti-weighted images (1×1×1 mm$^3$ resolution) were acquired using a Magnetization-Prepared RApid Gradient Echo (MPRAGE) sequence with TI/TR=950/2300 ms timing and a flip angle of 8°. Total acquisition for an unaccelerated dataset is about 8:00 minutes. In a separate study, images of the torso region were acquired using a Gradient Echo sequence with a flip angle of 60 degrees and TE/TR of 3.3/7.5 ms on a GE 1.5 T Excite-11 system. Several axial and oblique slices of full resolution data (256×256) were acquired from an 8 channel upper body coil arranged cylindrically around the torso.

In order to allow quantitative and qualitative performance evaluations, all data at full resolution and no acceleration were acquired. The aliased images for acceleration factors between 3 and 5 were obtained by manually undersampling in k-space. In each case the full rooted sum of squares (RSOS) image was also computed after dividing by the relative sensitivity maps obtained from calibration lines. The self-calibrating strategy for sensitivity estimation was used, whereby the centre of k-space is acquired at full density and used to estimate low-frequency (relative) sensitivity maps. The central 40 densely sampled calibration lines were used for this purpose. These lines were multiplied by an appropriate Kaiser-Bessel window to reduce ringing and noise, zero-padded to full resolution and transformed to the image domain. Relative sensitivity was estimated by dividing these images by their RSOS. To avoid division by zero a small threshold was introduced in the denominator, amounting to 5 percent of maximum intensity. This also served effectively to make the sensitivity maps have zero signal in background regions. However, further attempts at segmenting background/foreground from this low-frequency data proved unreliable in some cases and were not implemented.

Algorithmic parameters were chosen empirically. It was sufficient to quantize intensity labels to $N_{labels}=256$, since the resulting quantization error is much smaller than observed noise. The computational cost of EPIGRAM grows linearly with $N_{labels}$, so fewer labels are preferable. Model parameters were varied (geometrically) over the range $K\epsilon[N_{labels}/20, N_{labels}/2]$, $\lambda\epsilon[0.01\cdot\max(x),1\cdot\max(x)]$, to find the best values. However, performance was found to be rather insensitive to these choices, and the same parameters for all cases shown above were used. Graph cut algorithms are typically insensitive to initialization issues, and the zero image was chosen as an initial guess. All reconstructions were obtained after twenty iterations. Regularized SENSE reconstruction was used to compare with an embodiment of the method of these teachings. Regularization factor μ was chosen after visually evaluating image quality with a large range of values in the region $\mu\epsilon[0.01, 0.6]$. The images giving the best results are shown in the next section, along with those obtained with a higher regularization. The latter result was obtained to observe the noise versus aliasing performance of SENSE.

Apart from visual evidence presented in the next section, a quantitative performance evaluation was conducted on reconstructed in vivo data. For in vivo data the problem of ascertaining noise estimate or other performance measures is challenging due to the non-availability of an accurate reference image. Unfortunately none of the reconstruction methods implemented, whether RSOS, regularized SENSE or EPIGRAM, are unbiased estimators of the target. This makes direct estimation of noise performance difficult, and the traditional root mean square error (RMSE) is inadequate. instead a recent evaluation measure for parallel imaging methods proposed by Reeder et al (Reeder S B, Wintersperger B J, Dietrich O, Lanz T, Greiser A, Reiser M F, Glazer G M, Schoenberg S O. Practical Approaches to the Evaluation of Signal-to-Noise Ratio Performance with Parallel Imaging: Application with Cardiac Imaging and a 32-Channel Cardiac Coil. Magnetic Resonance in Medicine 2005; 54:748-754, which is incorporated by reference herein) is utilized, which provides an unambiguous and fair comparison of SNR and geometry factor. Two separate scans of the same target with identical settings are acquired, and their sum and difference obtained. The local signal level at each voxel is computed by averaging the sum image over a local window, and the noise level obtained from the standard deviation of the difference image over the same window. Then $$SNR = \frac{\text{mean(Sum image)}}{\sqrt{2}\, stdev(\text{Diff image})}$$

Here the mean and standard deviation are understood to be over a local window, in the case of these teachings a 5×5 window around the voxel in question. This provides unbiased estimates that are directly comparable across different reconstruction methods. A similar calculation is performed, with a crucial difference: instead of acquiring two scans, a single scan was used but add random uncorrelated Gaussian noise in the coil outputs to obtain two noisy data sets. This halves the acquisition effort without compromising estimate quality, since uncorrelated noise is essentially what the two-scan method also measures. Reeder et al explain that their method can be erroneous for in vivo data because motion and other physiological effects can seriously degrade noise estimates. The present modification, while achieving the same purpose, does not suffer from this problem, and hence should be more appropriate for in vivo data. The SNR calculation also allows the geometry factor or g-factor maps for each reconstruction method to be obtained. For each voxel p and acceleration factor R:

$$g(p, R) = \frac{SNR_{RSOS}(p)}{SNR(p)\sqrt{R}}$$

where $SNR_{RSOS}$ is the SNR of the RSOS reconstruction. The SNR and g-map images appeared quite noisy due to the division step and estimation errors, and they were smoothed for better visualization.

Figure 6:
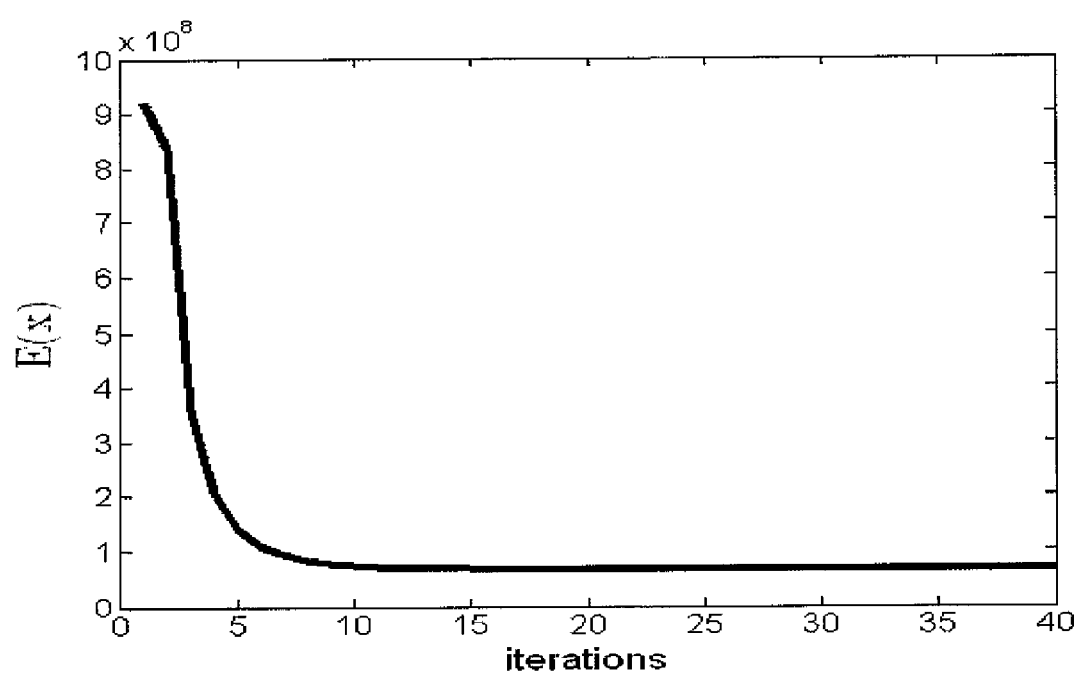
FIG. 6 shows Convergence behavior of an embodiment of the method of these teachings, the modified graph cut algorithm (hereinafter referred to as EPIGRAM), for acceleration factor R=3, L=8 coils, on GRE torso data.

The convergence behavior of the objective function [13] against the number of iterations for R=3, L=8 is shown in FIG. 6. FIG. 6 shows Convergence behavior of the modified graph cut algorithm (hereinafter referred to as EPIGRAM) for acceleration factor R=3, L=8 coils, on GRE torso data. The vertical axis shows the value of objective function [13] achieved after each outer iteration, which represents a single cycle through $N_{labels}$=256 expansion moves As is typical with graph cut algorithms, most of the improvement happens in the first few (approx 5) iterations. In one implementation of EPIGRAM, which is written primarily in MatLab, an iteration takes about a minute on this data set. Since EPIGRAM is almost linear in the number of nodes, total running time approximately scales as $N^2$, the image size.

The best parameter values were consistent across all in vivo data sets tried: $K=N_{labels}/7$. $\lambda=0.04\cdot\max(x)$. Results of several brain imaging experiments with these parameter values are displayed in FIGS. 7a-8d. FIGS. 7a-7d show reconstruction of a MPRAGE scan of a central sagittal slice, with an undersampling factor R=4 along A-P direction. The RSOS reference image is shown in (a), regularized SENSE with (empirically obtained optimal) $\mu$=0.08 in (b), regularized SENSE with $\mu$=0.16 in 7(c) and EPIGRAM in 7(d). Reduction in noise is visually noticeable in the EPIGRAM reconstruction, compared to both SENSE reconstructions. Higher regularization in SENSE caused unacceptable aliasing, as observed in 7(c). It should be noted that unregularized (i.e. standard) SENSE results were always worse than regularized SENSE, and have consequently not been shown. Another sagittal scan result is shown in FIGS. 8a-8d, this time from the left side of the patient. Image support is smaller, allowing 5× acceleration. The optimally regularized SENSE output (b), with $\mu$=0.1 is noisy at this level of acceleration, and $\mu$=0.2 in (c) introduced significant aliasing, especially along the central brain region. EPIGRAM (d) exhibits some loss of texture, but on the whole, appears to outperform SENSE.

A set of torso images acquired on GE 1.5 T scanner using a GRE sequence and acceleration factor of 3 (along A-P direction) is resolved from 40 sensitivity calibration lines. Various slice orientations, both axial and oblique, were used. Shown in FIGS. 9a-9f, this data also shows the practical limitation of SENSE when an inadequate number of calibration lines are used for sensitivity estimation. Reconstruction quality of SENSE is poor as a result of the combination of ill-conditioning of the matrix inverse and calibration error. SENSE exhibits both high noise as well as residual aliasing. In fact what appears at first sight to be uncorrelated noise is, upon finer visual inspection, found to arise from unresolved aliases, as the background in 10(b) clearly indicates. EPIGRAM has been able to resolve aliasing correctly and suppress noise, without blurring sharp edges and texture boundaries. To demonstrate the performance of these methods more clearly, zoomed in versions of the images in 9(a)-(c) are shown in 9(d)-(f).

The trade-off between noise and aliasing performance is demonstrated herein below in FIGS. 10a-10h. Views were acquired horizontally. FIGS. 10a-10g show another torso slice, along with associated g-maps computed as specified hereinabove. The effect of various regularizations of SENSE are investigated FIGS. 10(a) and 10(e) show SENSE reconstruction and its g-map for $\mu$=0.1. There is inadequate noise suppression, with a g-factor as high as 6. Results for $\mu$=0.3 are shown in 10(b), 10(f). The g-maps has become correspondingly flatter, but at the cost of aliasing. The rightmost column 10(d), 10(h) shows EPIGRAM results, which has significantly lower g values as well as lower aliasing artifacts. The SENSE algorithm with $\mu$=0.5 was used for FIGS. 10c and 10g. The results shown in 10(c), 10(g) match the EPIGRAM g-map, but yield unacceptable aliasing. The leftmost column, 10(a) and 10(e), show the SENSE result and its g-map for $\mu$=0.1. There appears to be inadequate noise suppression in the result shown in FIGS. 10a and 10e, where some regions of the image have a g-factor as high as 6. Noise amplification may be reduced by increasing regularization. In the next column results for are shown. The g-map has become correspondingly flatter, but the reconstruction indicates that this has been achieved at the cost of introducing some aliasing in the image. The rightmost column shows EPIGRAM results. In the next column results for the SENSE algorithm with $\mu$=0.3 are shown. The g-map has become correspondingly flatter, but the reconstruction indicates that this has been achieved at the cost of introducing some aliasing in the image. In the third column it can be shown that by an appropriate choice of it is possible to match the EPIGRAM g-map—compare (g) and (h). However, at this choice of $\mu$=0.5, SENSE yields unacceptable aliasing. Table 1 shows mean SNR and g-factor values of EPIGRAM and various regularizations of SENSE.

Figure 11:
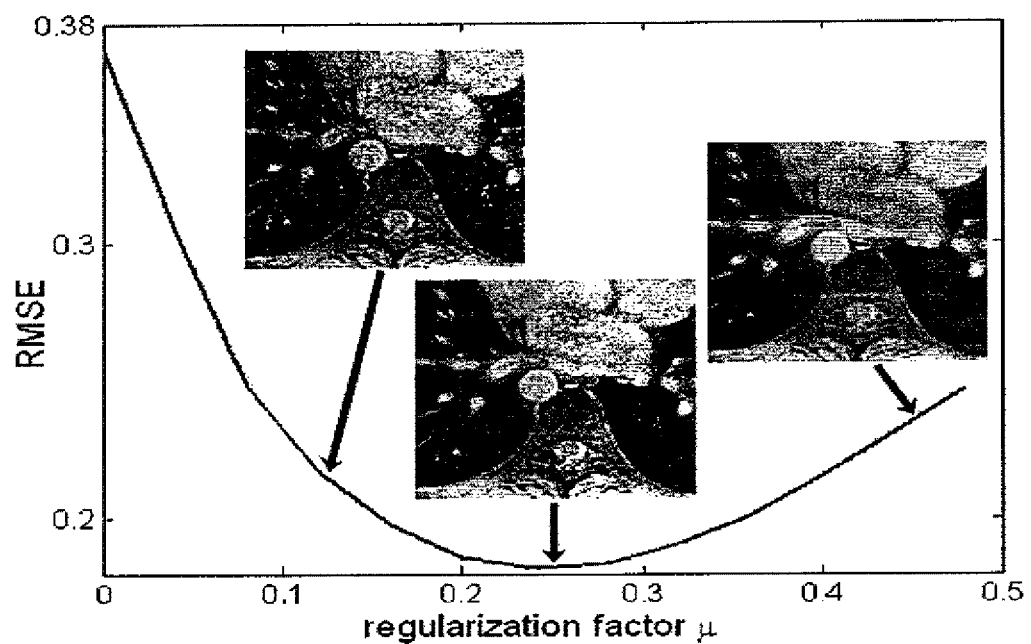
FIG. 11 represents a graph of Average RMSE of regularized SENSE reconstruction of torso data.

It is observed that the regularization needed in SENSE to match the EPIGRAM g values (approximately $\mu$=0.5 in almost all cases) yields unacceptable aliasing. Instead, a more modest must be chosen empirically. The standard RMSE criterion is not appropriate here. FIG. 11 represents a graph of Average RMSE of regularized SENSE reconstruction of torso data. The optimum was observed at around 0.25, although visual quality was found to be best for smaller values, in the region [0.1-0.2]. Three example torso reconstructions are also shown. Observe that as regularization increases, residual aliasing artifacts and blurring both get worse. Also note that non-regularized SENSE (i.e., $\mu$=0) gives substantially worse RMSE. In FIG. 11 displays the average over all the torso data, of the root mean square error for various regularization factors. For this data set, the optimal $\mu$ in terms of RMSE was found to be around 0.25, although in practice the best visual quality was observed below this value, around 0.1-0.15. This seems to suggest that the RMSE measure does not capture reconstruction quality very accurately; in particular it seems to under-emphasize the effect of residual aliasing. In all experimental data shown in this section, the optimal regularization for SENSE was obtained empirically for each data set by visual inspection as far as possible. To give an idea of the visual quality corresponding to a certain $\mu$ value, FIG. 11 also shows a portion of the resulting SENSE reconstruction. Mean SNR and g-factor for all reconstruction examples presented here are summarized in Table 2. Non-regularized SENSE data are not shown since they are always worse than regularized SENSE.

TABLE 1

Mean reconstructed SNR and mean g-factor values of reconstructed data for various regularization factors, with R = 3, L = 8. Two data sets, Cardiac B and Brain A were used. The means are over object foreground. RSOS mean g value is 1 by definition.

| | Cardiac B | | Brain A | |
|---|---|---|---|---|
| | mean SNR | mean g | Mean SNR | Mean g |
| RSOS | 42 | 1.0 | 59 | 1.0 |
| SENSE, $\mu$ = 0.1 | 15 | 3.3 | 21 | 3.7 |
| SENSE, $\mu$ = 0.3 | 18 | 2.3 | 26 | 2.5 |
| SENSE, $\mu$ = 0.5 | 24 | 1.4 | 30 | 1.9 |
| EPIGRAM | 36 | 1.4 | 40 | 1.85 |

TABLE 2

Quantitative performance measures for reconstruction examples. Both mean reconstructed SNR and mean g-factor values are shown. The means are over object foreground wherever the latter was available. Corresponding reconstructed images were presented in FIGS. 8a-11. Note that numbers for large µ shown below are closer to EPIGRAM numbers, but produce images with considerably more aliasing.

|  | R | SENSE, optimal µ | | SENSE, large µ | | EPIGRAM | |
| --- | --- | --- | --- | --- | --- | --- | --- |
|  |  | mean SNR | Mean g | Mean SNR | Mean g | Mean SNR | Mean g |
| Brain A | 4 | 8 | 4.6 | 13 | 2.4 | 23 | 1.7 |
| Brain B | 5 | 10 | 3.5 | 13 | 2.4 | 17 | 2.2 |
| Cardiac A | 3 | 20 | 2.3 | 25 | 1.6 | 33 | 1.5 |
| Cardiac B | 3 | 15 | 3.3 | 18 | 2.3 | 36 | 1.4 |

Figure 12:
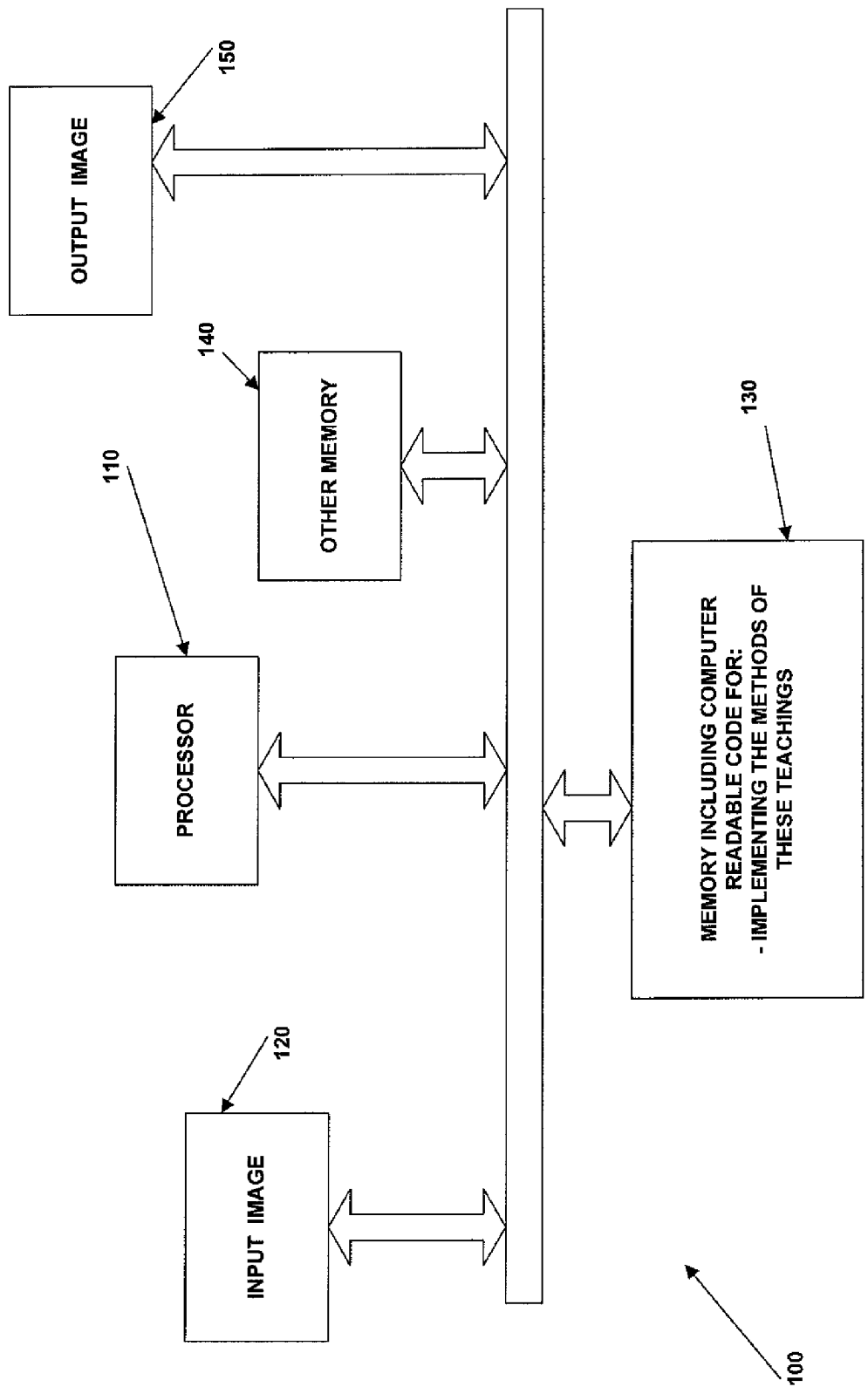
FIG. 12 is a block diagram representation of an embodiment of a component of the system of these teachings.

One embodiment of components of a system of these teachings is shown in FIG. 12. Referring to FIG. 12, a processor 110 and supporting computer usable medium (memory, in one instance) 130 could be used to implement the method of this invention. The computer usable medium 130 as computer readable code embodied therein, the computer readable code being capable of causing the processor 110 (or one or more processors) to implement the methods of these teachings such as the embodiments described herein above. Processor 110 can be a dedicated processor, or a digital signal processor, or a general purpose processor and supporting memory 130 could be any computer usable medium. The processor and memory systems and the code to cause the processor to implement the methods of this invention constitute means for expressing the reconstruction of MR images as the minimization of an energy-like function, for applying a predetermined transformation that converts the energy-like function into another energy-like function, the other energy-like function being amenable to minimization by graph cuts, and for minimizing the other energy-like function by graph cuts.

It should be noted that although the above disclosed exemplary embodiment was described in terms of MR image reconstruction, applications of the methods and systems of these teachings to other inverse problems (such as, but not limited to, image deblurring, nondestructive testing problems, seismic inverse problems, flow source reconstruction problems, and others) are within the scope of these teachings.

Several other exemplary embodiments, in which the methods and systems of these teachings can be applied, are presented hereinbelow. It should be noted that these teachings are not limited to only this exemplary embodiments but other embodiments are also within the scope of these teachings.

In one exemplary embodiment, briefly described herein below, the method and systems of these teachings are applied to image deblurring. One typical image processing task includes processing a blurry input image to remove the blur and sharpen the image, a process called deblurring. The image deblurring problem is usually posed as an inverse problem, whereby given a known blurring function and the observed blurry image, the task is to estimate the original, but unknown, sharp image. The blurring operator can be represented by a kernel H, usually with a banded matrix structure. The process of blurring, in that representation, has a linear form:

$$y=Hx,$$

where x is the original image to be estimated, and y is the observed blurred and noisy image.

An embodiment of the method of these teachings can be directly applied to the image deblurring problem to obtain an estimate of x, by minimizing the energy-like function $$E(x)=\|y-Hx\|^2+G(x)$$

where G(x) is substantially identical or similar to the term in the MR application.

In another exemplary embodiment of the method of these teachings, the method of these teachings is applied to Magneto Encephalography (MEG) Source Localization. (It should be noted that similar exemplary embodiments involving source localization occur in various other fields from determination of pollutant or similar sources into complex flow to problems in electromagnetic signal detection where there are many sources, incomplete measurements, small signals and high noise, making the reconstruction program ill posed if treated by standard methods.)

MEG is a promising technology for the detection and recording of magnetic signals at the surface of the head arising from the human cerebral cortex. Approximately 100-300 magnetic sensors at surface measure magnetic fields induced by neural activity in the cortex.

One problem in MEG imaging is pinpointing the location within the cortex of the recorded signals. This is a difficult problem since tomographic reconstruction from these measurements is highly ill-posed and under-determined, with 2562 voxels to be estimated, but only 300 observations available. This is another inverse problem that is amenable to a solution by the method of these teachings.

In one instance, x represents a collection of magnetic moments at all voxels, and y represents a collection of the measured magnetic signal from surface sensors. In that representation, the forward model for the propagation of the magnetic fields from the cortex to the surface (known as "Lead Field" in the literature) is given by the matrix L. Then, the forward problem is given by $$y=Lx+n,$$

and the quantity x can be estimated by minimizing the following energy-like functional using the method of these teachings, $$E(x)=\|y-Lx\|2+G(x)$$

where G(x) is substantially identical or similar to the corresponding term in the MR application.

In another exemplary embodiment, the method of these teachings is applied to Multiuser detection in CDMA. Code Division Multiple Access (CDMA) systems are one type of cellular mobile phone systems. Since in CDMA, the individual user signals within the same cell are separated not by frequency (as in GSM systems) but by the unique code assigned to each user, CDMA systems at their core need to be able to separate the individual user signals from the collection of signals received at the cell base station from all users within that cell. This process is called multi-user detection (MUD). MUD is well-modeled as a linear system of the form $$r=RAb+n$$

where R,A represents the channel transfer function and code, respectively; r is the observed overall signal at the cell base, b is the collection of symbols (bits) being sent by each user, and n is random noise. For N users transmitting K bits in each block, $b \in \{0,1\}^{NK}$. This forward linear model assumes a synchronous system, additive white Gaussian noise, and equiprobable symbols from all users.

MUD is generally solved via a jointly optimal multiuser detection decision rule:

$$b^* = \arg\min\{b^T ARAb - 2b^T Ar\},$$

which is equivalent to minimizing the following energy-like functional $$E(b) = \|r - RAb\|^2.$$

S. Verdu et al showed that MUD is NP-hard, meaning that no efficient algorithm can be designed to find the best possible symbol estimate in non-exponential time. The minimization of the above functional is computationally unfeasible under conventional methods like Viterbi search, but can be performed efficiently using the method of these teachings, since the energy-like functional above is in the same mathematical form as the other energy-like functionals described earlier.

In general, the techniques described above may be implemented, for example, in hardware, software, firmware, or any combination thereof. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to data entered using the input device to perform the functions described and to generate output information. The output information may be applied to one or more output devices.

Elements and components described herein may be further divided into additional components or joined together to form fewer components for performing the same functions.

Each computer program within the scope of the claims below may be implemented in any programming language, such as assembly language, machine language, a high-level procedural programming language, or an object-oriented programming language. The programming language may be a compiled or interpreted programming language.

Each computer program may be implemented in a computer program product tangibly embodied in a computer-readable storage device for execution by a computer processor. Method steps of the invention may be performed by a computer processor executing a program tangibly embodied on a computer-readable medium to perform functions of the invention by operating on input and generating output.

Common forms of computer-readable media include, for example, a floppy disk, a flexible disk, hard disk, magnetic tape, or any other magnetic medium, a CDROM, any other optical medium, punched cards, paper tape, any other physical medium with patterns of holes, a RAM, a PROM, and EPROM, a FLASH-EPROM, any other memory chip or cartridge, or any other medium from which a computer can read. From a technological standpoint, a signal or carrier wave (such as conventionally used for Internet distribution of software) encoded with functional descriptive material is similar to a computer-readable medium encoded with functional descriptive material, in that they both create a functional interrelationship with a computer. In other words, a computer is able to execute the encoded functions, regardless of whether the format is a disk or a signal.

Although these teachings has been described with respect to various embodiments, it should be realized these teachings are also capable of a wide variety of further and other embodiments within the spirit of the appended claims.

What is claimed is:

1. A method, implemented utilizing a computer, for reconstruction of objects, the method comprising the steps of:
   expressing the reconstruction of an object as minimization of a function; the reconstruction of the object comprising an inverse problem; an object being an input/representation of input to a system, the system providing output data resulting from the input; the object being reconstructed from the output data obtained from interaction of the object with the system;
   applying a predetermined transformation, said predetermined transformation converting the function into another function, said another function being amenable to minimization by a minimization method utilizing graph cuts; and
   obtaining the reconstruction of the object by minimizing said another function by said minimization method utilizing graph cuts;
   the steps of applying a predetermined transformation and minimizing said another function being performed by means of a computer usable medium having computer readable code that causes the computer to perform the steps.

2. The method of claim 1 wherein the minimization method utilizing graph cuts comprises the steps of:
   a) providing an initial solution having a plurality of labels, wherein each pixel from a plurality of pixels has a corresponding pixel label from the plurality of labels;
   b) forming a graph from said initial solution, said graph being comprised of nodes and of edges connecting said nodes, each said pixel having a corresponding node;
   c) selecting a move from said graph, wherein said move comprises assigning a new corresponding pixel label to at least one pixel from said plurality of pixels;
   d) assigning a weight value to each said edge of said graphed graph;
   e) determining a minimum graph cut in response to said assigned weights, wherein a graph cut comprises a subset of said edges; a minimum graph cut having a smallest value of a cost;
   f) forming another graph from graphing results of said minimum graph cut; and
   g) repeating steps c-f until an acceptable solution according to a predetermined criterion is reached.

3. The method of claim 2 wherein said move is an $\alpha$-expansion; wherein said $\alpha$-expansion comprises assigning a label a to a subset of said pixels, said subset having at least one pixel.

4. The method of claim 2 wherein the step of applying the predetermined transformation comprises the steps of:
   assigning to said each pixel from said plurality of pixels a binary variable indicating whether said each pixel acquired the new corresponding pixel label in the move;
   assigning to said each pixel another binary variable, said another binary variable being a complement of said binary variable;
   said another function being a function of said binary variable and said another binary variable; said another function being submodular; a submodular function of two variables being a function wherein a sum of two consecutive diagonal terms is at most equal to a sum of two off diagonal terms, each one of said two off diagonal terms being adjacent to each one of said two consecutive diagonal terms.

5. The method of claim 2 wherein said predetermined criterion comprises obtaining a substantially minimum cost; and wherein said cost comprises said another function.

6. The method of claim 1 wherein the minimization method utilizing graph cuts and the steps of applying the predetermined transformation and minimizing said another function by the minimization method utilizing graph cuts comprise the steps of:
- a) providing an initial solution having a plurality of labels, wherein each pixel from a plurality of pixels has a corresponding pixel label from the plurality of labels;
- b) graphing forming a graph from said initial solution, said graph being comprised of nodes and of edges connecting said nodes, each said pixel having a corresponding node;
- c) selecting a move from said graph, wherein said move comprises assigning a new corresponding pixel label to at least one pixel from said plurality of pixels;
- d) assigning to said each pixel from said plurality of pixels a binary variable indicating whether said each pixel acquired the new corresponding pixel label in the move;
- e) assigning to said each pixel another binary variable, said another binary variable being a complement of said binary variable;
- said another function being a function of said binary variable and said another binary variable; said another function being submodular; a submodular function of two variables being a function wherein a sum of two consecutive diagonal terms is at most equal to a sum of two offdiagonal terms, each one of said two offdiagonal terms being adjacent to each one of said two consecutive diagonal terms;
- f) assigning a weight value to each said edge of said graph;
- g) determining a minimum graph cut in response to said assigned weights, wherein a graph cut comprises a subset of said edges; a minimum graph cut having a smallest value of said another function;
- h) forming another graph from graphing results of said minimum graph cut; and
- i) repeating steps c, f-h until a substantially minimum value of said another function is reached.

7. The method of claim 1 wherein the object comprises MR images.

8. The method of claim 1 wherein the object comprises an image after deblurring.

9. The method of claim 1 wherein the object comprises location of magnetic field sources in Magneto Encephalography.

10. The method of claim 1 wherein the object comprises individual user signals separated from a collection of signals received at a base station in a CDMA system.

11. A system comprising:
- at least one processor; and
- at least one computer usable medium having computer readable code embodied therein, said computer readable code being capable of causing said at least one processor to:
- receive data from interaction of an object with a system;
- express reconstruction of the object as minimization of a function obtained from the received data; the reconstruction of the object comprising an inverse problem; an object being an input/representation of input to a system, the system providing output data resulting from the input; the object being reconstructed from the output data obtained from interaction of the object with the system;
- apply a predetermined transformation, said predetermined transformation converting the function into another function, said another function being amenable to minimization by a minimization method utilizing graph cuts; and
- minimize said another function by said minimization method utilizing graph cuts;
- obtain the reconstruction of the object from the minimization of said another function.

12. The system of claim 11 wherein, in minimizing said another function, said computer readable code is capable of causing said at least one processor to:
- a) provide an initial solution having a plurality of labels, wherein each pixel from a plurality of pixels has a corresponding pixel label from the plurality of labels;
- b) graphing form a graph from said initial solution, said graph being comprised of nodes and of edges connecting said nodes, each said pixel having a corresponding node;
- c) select a move from said graph, wherein said move comprises assigning a new corresponding pixel label to at least one pixel from said plurality of pixels;
- d) assign a weight value to each said edge of said graph;
- e) determine a minimum graph cut in response to said assigned weights, wherein a graph cut comprises a subset of said edges; a minimum graph cut having a smallest value of a cost;
- f) form a graph from graphing results of said minimum graph cut; and
- g) repeat steps c-f until an acceptable solution according to a predetermined criterion is reached.

13. The system of claim 12 wherein said move is an $\alpha$-expansion; wherein said $\alpha$-expansion comprises assigning a label a to a subset of said pixels, said subset having at least one pixel.

14. The system of claim 12 wherein, in applying said predetermined transformation, said computer readable code is capable of causing said at least one processor to:
- assign to said each pixel from said plurality of pixels a binary variable indicating whether said each pixel acquired the new corresponding pixel label in the move;
- assign to said each pixel another binary variable, said another binary variable being a complement of said binary variable;
- said another function being a function of said binary variable and said another binary variable; said another function being submodular; a submodular function of two variables being a function wherein a sum of two consecutive diagonal terms is at most equal to a sum of two offdiagonal terms, each one of said two offdiagonal terms being adjacent to each one of said two consecutive diagonal terms.

15. The system of claim 12 wherein said predetermined criterion comprises obtaining a substantially minimum cost; and wherein said cost comprises said another function.

16. The system of claim 11 wherein, in applying the predetermined transformation and minimizing said another function by the minimization method utilizing graph cuts, said computer readable code is capable of causing said at least one processor to:
- a) provide an initial solution having a plurality of labels, wherein each pixel from a plurality of pixels has a corresponding pixel label from the plurality of labels;
- b) graphing form a graph from said initial solution, said graph being comprised of nodes and of edges connecting said nodes, each said pixel having a corresponding node;
- c) select a move from said graph, wherein said move comprises assigning a new corresponding pixel label to at least one pixel from said plurality of pixels;
- d) assign to said each pixel from said plurality of pixels a binary variable indicating whether said each pixel acquired the new corresponding pixel label in the move;
- e) assign to said each pixel another binary variable, said another binary variable being a complement of said binary variable;
- said another function being a function of said binary variable and said another binary variable; said another function being submodular; a submodular function of two variables being a function wherein a sum of two consecutive diagonal terms is at most equal to a sum of two offdiagonal terms, each one of said two of diagonal terms being adjacent to each one of said two consecutive diagonal terms f) assign a weight value to each said edge of said graph;

g) determine a minimum graph cut in response to said assigned weights, wherein a graph cut comprises a subset of said edges; a minimum graph cut having a smallest value of said another function;

h) form a graph from graphing results of said minimum graph cut; and i) repeat steps c, f-h until an acceptable solution according to a substantially minimum value of said another function is reached.

17. The system of claim 11 wherein the object comprises MR images and the system comprises at least two MR receiver coils.

18. A computer program product comprising:

a non-transitory computer usable medium having computer readable code embodied therein, said computer readable code being capable of causing at least one processor to:

receive data from system;

express reconstruction of an object as minimization of a function obtained from the received data; the reconstruction of the object comprising an inverse problem; an object being an input/representation of input to a system, the system providing output data resulting from the input; the object being reconstructed from the output data obtained from interaction of the object with the system;

apply a predetermined transformation, said predetermined transformation converting the function into another function, said another function being amenable to minimization by a minimization method utilizing graph cuts; and minimize said another function by said minimization method utilizing graph cuts;

obtain the reconstruction of the object from the minimization of said another function.

19. The computer program product of claim 18 wherein, in minimizing said another function, said computer readable code is capable of causing said at least one processor to:

a) provide an initial solution having a plurality of labels, wherein each pixel from a plurality of pixels has a corresponding pixel label from the plurality of labels;

b) graphing form a graph from said initial solution, said graph being comprised of nodes and of edges connecting said nodes, each said pixel having a corresponding node;

c) select a move from said graph, wherein said move comprises assigning a new corresponding pixel label to at least one pixel from said plurality of pixels;

d) assign a weight value to each said edge of said graph;

e) determine a minimum graph cut in response to said assigned weights, wherein a graph cut comprises a subset of said edges; a minimum graph cut having a smallest value of a cost;

f) form a graph from graphing results of said minimum graph cut; and g) repeat steps c-f until an acceptable solution according to a predetermined criterion is reached.

20. The computer program product of claim 19 wherein said move is an α-expansion; wherein said α-expansion comprises assigning a label a to a subset of said pixels, said subset having at least one pixel.

21. The computer program product of claim 19 wherein, in applying said predetermined transformation, said computer readable code is capable of causing said at least one processor to:

assign to said each pixel from said plurality of pixels a binary variable indicating whether said each pixel acquired the new corresponding pixel label in the move;

assign to said each pixel another binary variable, said another binary variable being a complement of said binary variable;

said another function being a function of said binary variable and said another binary variable; said another function being submodular; a submodular function of two variables being a function wherein a sum of two consecutive diagonal terms is at most equal to a sum of two off diagonal terms, each one of said two off diagonal terms being adjacent to each one of said two consecutive diagonal terms.

22. The computer program product of claim 19 wherein said predetermined criterion comprises obtaining a substantially minimum cost; and wherein said cost comprises said another function.

23. The computer program product of claim 18 wherein, in applying the predetermined transformation and minimizing said another function by the minimization method utilizing graph cuts, said computer readable code is capable of causing said at least one processor to:

a) provide an initial solution having a plurality of labels, wherein each pixel from a plurality of pixels has a corresponding pixel label from the plurality of labels;

b) graphing forming a graph from said initial solution, said graph being comprised of nodes and of edges connecting said nodes, each said pixel having a corresponding node;

c) select a move from said graph, wherein said move comprises assigning a new corresponding pixel label to at least one pixel from said plurality of pixels;

d) assign to said each pixel from said plurality of pixels a binary variable indicating whether said each pixel acquired the new corresponding pixel label in the move;

e) assign to said each pixel another binary variable, said another binary variable being a complement of said binary variable;

said another function being a function of said binary variable and said another binary variable; said another function being submodular; a submodular function of two variables being a function wherein a sum of two consecutive diagonal terms is at most equal to a sum of two offdiagonal terms, each one of said two offdiagonal terms being adjacent to each one of said two consecutive diagonal terms f) assign a weight value to each said edge of said graph;

g) determine a minimum graph cut in response to said assigned weights, wherein a graph cut comprises a subset of said edges; a minimum graph cut having a smallest value of said another function;

h) form a graph from graphing results of said minimum graph cut; and i) repeat steps c, f-h until a substantially minimum value of said another function is reached.

24. The computer program product of claim 18 wherein the object comprises MR images and the system comprises at least two MR receiver coils.

* * * * *

UNITED STATES PATENT AND TRADEMARK OFFICE
CERTIFICATE OF CORRECTION

PATENT NO. : 8,103,068 B2
APPLICATION NO. : 11/864088
DATED : January 24, 2012
INVENTOR(S) : Ramin D. Zabih et al.

Page 1 of 1

It is certified that error appears in the above-identified patent and that said Letters Patent is hereby corrected as shown below:

In Column 20, line 48 (claim 3), "label a" should read -- label $\alpha$ --
In Column 22, line 9 (claim 12), "b) graphing form a graph" should read -- b) form a graph --
In Column 22, line 25 (claim 13), "label a" should read -- label $\alpha$ --
In Column 22, line 54 (claim 16), "b) graphing form a graph" should read -- b) form a graph --
In Column 23, line 3 (claim 16), "two of diagonal" should read -- two off diagonal --
In Column 23, line 5 (claim 16), "terms" should read -- terms; --
In Column 23, line 65 (claim 20), "label a" should read -- label $\alpha$ --
In Column 24, line 32 (claim 23), "b) graphing form a graph" should read -- b) form a graph --
In Column 24, line 51 (claim 23), "terms" should read -- terms; --

Signed and Sealed this
Twenty-fourth Day of July, 2012

David J. Kappos
*Director of the United States Patent and Trademark Office*